(12) United States Patent
Matsumoto

(10) Patent No.: US 12,207,464 B2
(45) Date of Patent: Jan. 21, 2025

(54) METHOD OF MANUFACTURING SEMICONDUCTOR DEVICE

(71) Applicant: RENESAS ELECTRONICS CORPORATION, Tokyo (JP)

(72) Inventor: Satoru Matsumoto, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 584 days.

(21) Appl. No.: 17/513,421

(22) Filed: Oct. 28, 2021

(65) Prior Publication Data
US 2022/0165743 A1   May 26, 2022

(30) Foreign Application Priority Data

Nov. 20, 2020  (JP) ................................ 2020-193694

(51) Int. Cl.
*H10B 43/00* (2023.01)
*H10B 41/35* (2023.01)
*H10B 41/40* (2023.01)

(52) U.S. Cl.
CPC ............. *H10B 43/00* (2023.02); *H10B 41/35* (2023.02); *H10B 41/40* (2023.02)

(58) Field of Classification Search
None
See application file for complete search history.

(56) References Cited

U.S. PATENT DOCUMENTS

| 7,141,475 B2 * | 11/2006 | Adachi ................. G11C 16/10 438/258 |
| 7,872,298 B2 | 1/2011 | Shimamoto et al. |

(Continued)

FOREIGN PATENT DOCUMENTS

| CN | 101030556 A | * 9/2007 | ..... H01L 21/823462 |
| JP | 2006114925 A | * 4/2006 | ......... G11C 16/0466 |

(Continued)

OTHER PUBLICATIONS

Shimamoto Y et al., "Advantages of gate work-function engineering by incorporating sub-monolayer Hf at SiON/poly-Si Interface in low-power CMOS", Digest of Technical Papers. 2005 Symposium on VLSI Technology, Kyoto, Japan, Jun. 14-16, 2005, pp. 132-133.

(Continued)

*Primary Examiner* — Michael Lebentritt
(74) *Attorney, Agent, or Firm* — Rimon P.C.

(57) ABSTRACT

An insulating film is formed on a semiconductor substrate, and a silicon film is formed on the insulating film. The silicon film and the insulating film in a transistor forming region are removed, and the silicon film and the insulating film in a transistor forming region are left. An insulating film is formed on the semiconductor substrate in the transistor forming region. A Hf-containing film is formed on the insulating film and the silicon film, and a silicon film is formed on the Hf-containing film. Then, a gate electrode is formed by patterning the silicon film, and a gate electrode is formed by patterning the silicon film. A gate insulating film under the gate electrode is formed by the insulating film, and a gate insulating film under the gate electrode is formed by the insulating film and the Hf-containing film.

18 Claims, 29 Drawing Sheets

(56) References Cited

U.S. PATENT DOCUMENTS

| | | | |
|---|---|---|---|
| 8,951,869 B2 | 2/2015 | Tsukamoto et al. | |
| 10,186,518 B2 | 1/2019 | Yamaguchi | |
| 2014/0103441 A1 | 4/2014 | Kim et al. | |
| 2014/0227839 A1* | 8/2014 | Shinohara | H01L 29/40117 |
| | | | 438/261 |
| 2018/0286881 A1 | 10/2018 | Yamakoshi et al. | |
| 2018/0308957 A1* | 10/2018 | Abe | H01L 29/4234 |
| 2019/0123182 A1* | 4/2019 | Yamamoto | H01L 21/84 |
| 2019/0172837 A1* | 6/2019 | Yamashita | H01L 29/7855 |

FOREIGN PATENT DOCUMENTS

| | | | | |
|---|---|---|---|---|
| JP | 2008-041832 A | 2/2008 | | |
| JP | 2015-002309 A1 | 1/2015 | | |
| JP | 2018-170444 A1 | 11/2018 | | |
| JP | 2022082242 A * | 6/2022 | | H01L 27/11524 |

OTHER PUBLICATIONS

Extended European Search Report issued in corresponding European Patent Application No. 21206361.4-1212, dated Apr. 26, 2022.
Notice of Reasons for Refusal received in corresponding Japanese Patent Application No. 2020-193694, dated Mar. 5, 2024.

* cited by examiner

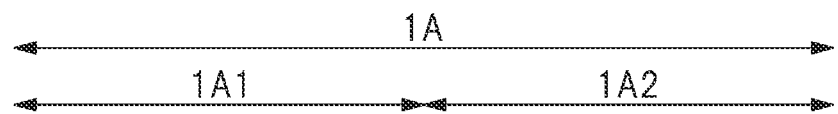
FIG. 51
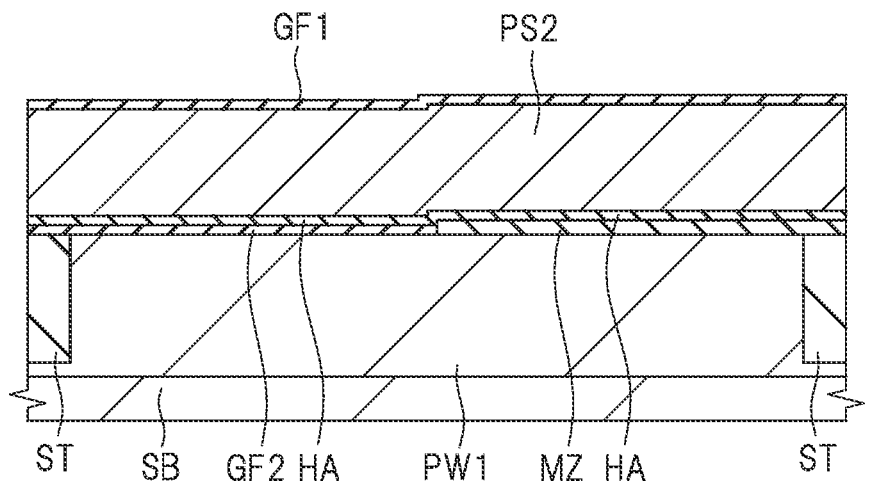
FIG. 52
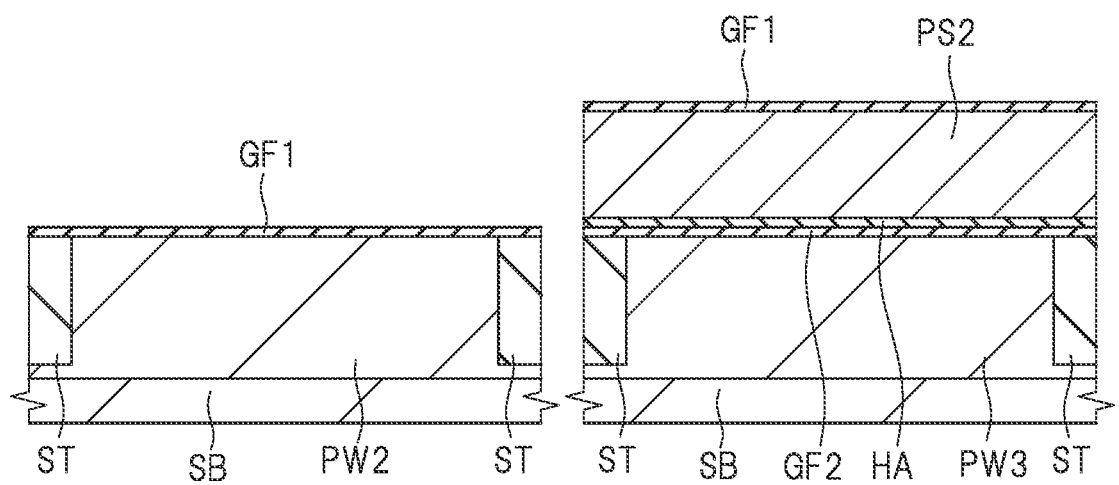

METHOD OF MANUFACTURING SEMICONDUCTOR DEVICE

CROSS-REFERENCE TO RELATED APPLICATION

The present application claims priority from Japanese Patent Application No. 2020-193694 filed on Nov. 20, 2020, the content of which is hereby incorporated by reference into this application.

BACKGROUND

The present invention relates to a method of manufacturing a semiconductor device, and can be suitably used for, for example, a method of manufacturing a semiconductor device having a transistor.

A MISFET (Metal Insulator Semiconductor Field Effect Transistor) can be formed by forming a gate electrode on a semiconductor substrate via a gate insulating film and forming a semiconductor region for source/drain on the semiconductor substrate.

Japanese patent application laid-open No. 2008-41832 (Patent Document 1) discloses a MISFET in which a High-k material typified by Hf is introduced into a gate insulating film.

SUMMARY

It is desired to improve performance of a semiconductor device having a MISFET.

Other problems and novel features will become apparent from descriptions of the present specification and the accompanying drawings.

According to one embodiment, a method of manufacturing a semiconductor device includes: (a) forming a first insulating film on a first and second regions of a semiconductor substrate; (b) forming a first conductive film on the first insulating film; and (c) removing the first insulating film and the first conductive film on the second region of the semiconductor substrate to leave the first insulating film and the first conductive film on the first region of the semiconductor substrate. The method of manufacturing a semiconductor device further includes: (d) forming a second insulating film on the second region of the semiconductor substrate; (e) forming, on the second insulating film and the first conductive film, a first film containing a first element; and (f) forming a second conductive film on the first film. The method of manufacturing a semiconductor device further includes (g) forming a second gate electrode by patterning the second conductive film, and forming a first gate electrode by patterning the first conductive film. The first gate electrode is formed on the first region of the semiconductor substrate via a first gate insulating film not containing the first element, and the second gate electrode is formed on the second region of the semiconductor substrate via a second gate insulating film containing the first element. The first element is any of Hf, Al, or Zr. The first gate insulating film is formed of the first insulating film, and the second gate insulating film is formed of the second insulating film and the first film.

According to one embodiment, a method of manufacturing a semiconductor device includes: (a) forming a second insulating film on a first and second regions of a semiconductor substrate; (b) forming, on the second insulating film, a first film containing a first element; and (C) forming a second conductive film on the first film. The method of manufacturing a semiconductor device further includes: (d) removing the second insulating film, the first film, and the second conductive film on the first region of the semiconductor substrate to leave the second insulating film, the first film, and the second conductive film on the second region of the semiconductor substrate; and (e) forming a first insulating film on the first region of the semiconductor substrate and the second conductive film. The method of manufacturing a semiconductor device further includes: (f) forming a first conductive film on the first insulating film; and (g) patterning the second conductive film to form the second gate electrode, and patterning the first conductive film to form the first gate electrode. The first gate electrode is formed on the first region of the semiconductor substrate via a first gate insulating film not containing the first element, and the second gate electrode is formed on the second region of the semiconductor substrate via a second gate insulating film containing the first element. The first element is any of Hf, Al, or Zr. The first gate insulating film is formed of the first insulating film, and the second gate insulating film is formed of the second insulating film and the first film.

According to one embodiment, the performance of the semiconductor device can be improved.

BRIEF DESCRIPTION OF THE DRAWINGS

FIG. 51 is a cross-sectional view of a main part of a semiconductor device during a manufacturing process following FIG. 49.

FIG. 52 is a cross-sectional view of a main part of the same semiconductor device as that in FIG. 51 during the manufacturing process.

DETAILED DESCRIPTION

Figure 1:
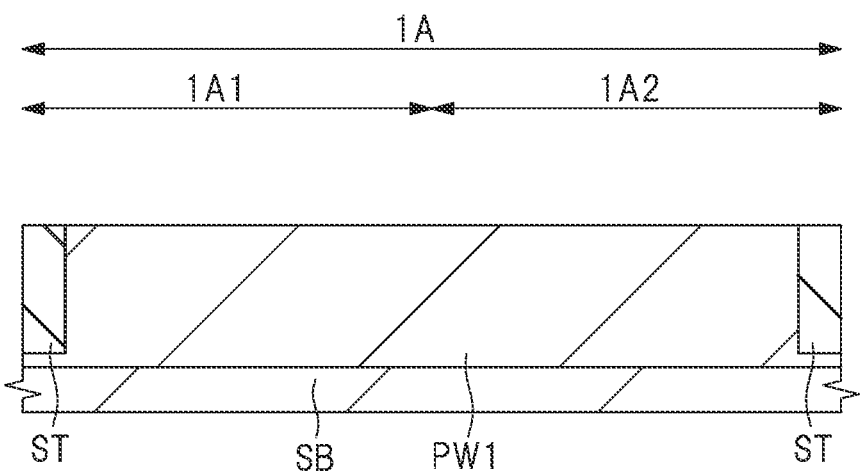
FIG. 1 is a cross-sectional view of a main part of a semiconductor device according to an embodiment during a manufacturing process.

In the embodiments described below, the invention will be divided into a plurality of sections or embodiments and described when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, embodiments of the present invention will be described in detail with reference to the accompanying drawings. Note that components having the same function are denoted by the same reference characters throughout the drawings for describing the embodiments, and the repetitive description thereof will be omitted. In addition, in the embodiments described below, the description of the same or similar portions is not repeated in principle unless particularly required in the following embodiments.

Also, in some drawings used in the following embodiments, hatching is omitted even in a cross-sectional view so as to make the drawings easy to see. In addition, hatching is used even in a plan view so as to make the drawings easy to see.

First Embodiment

Figure 3:
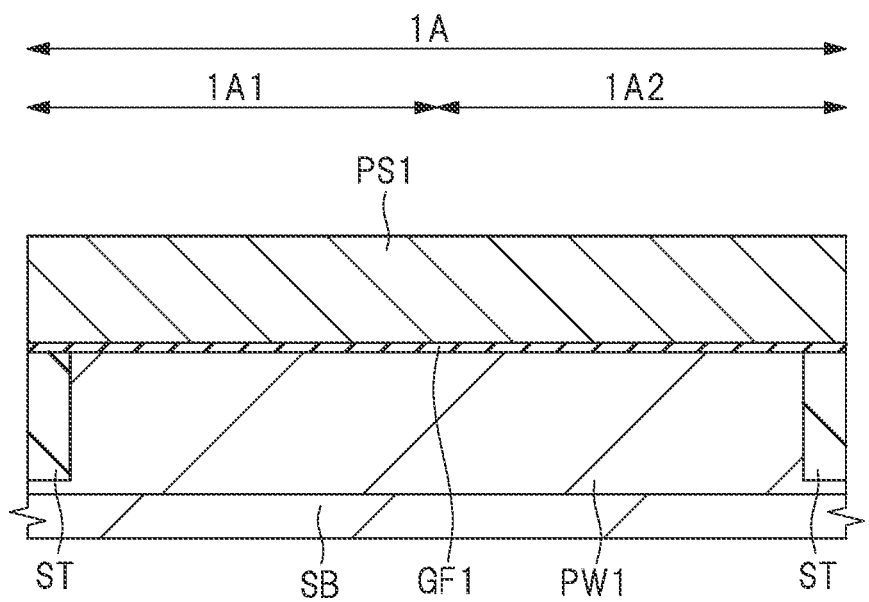
FIG. 3 is a cross-sectional view of a main part of a semiconductor device during a manufacturing process following FIG. 1.
Figure 4:
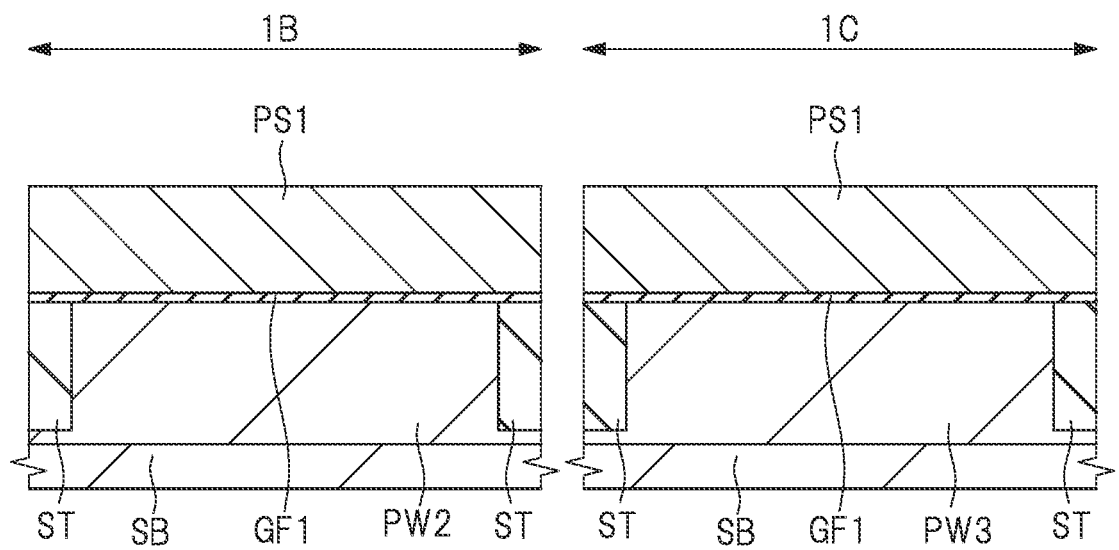
FIG. 4 is a cross-sectional view of a main part of the same semiconductor device as that in FIG. 3 during the manufacturing process.
Figure 5:
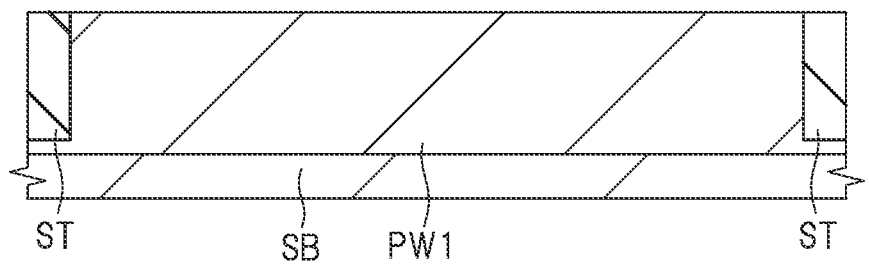
FIG. 5 is a cross-sectional view of a main part of a semiconductor device during a manufacturing process following FIG. 3.
Figure 6:
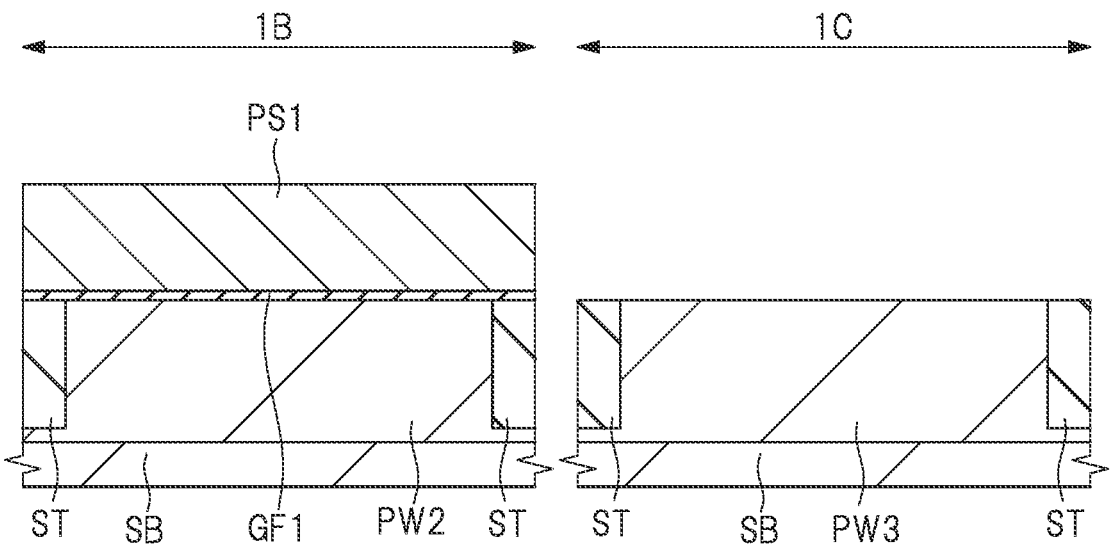
FIG. 6 is a cross-sectional view of a main part of the same semiconductor device as that in FIG. 5 during the manufacturing process
Figure 7:
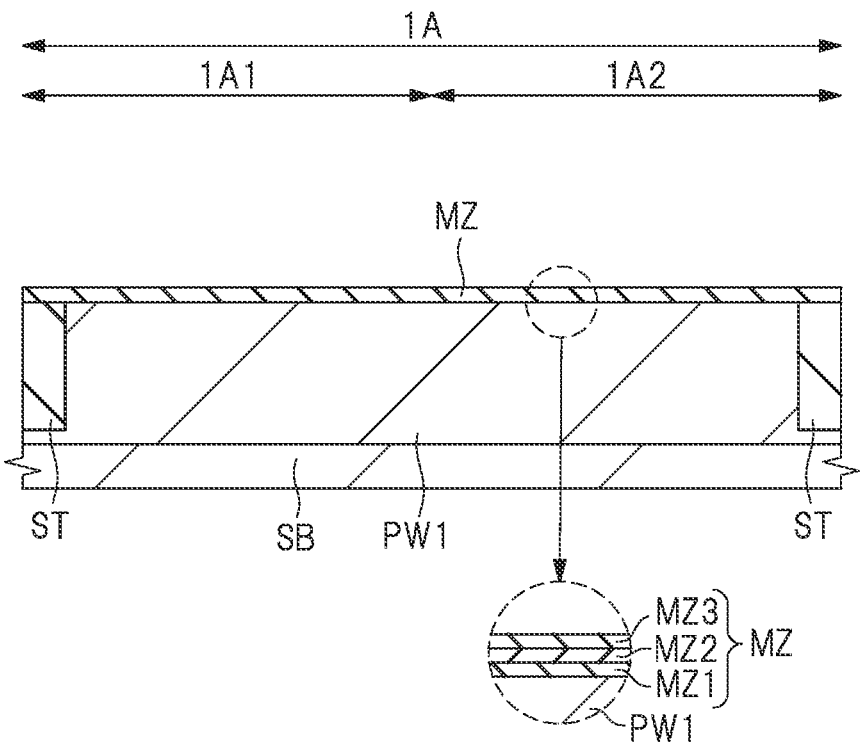
FIG. 7 is a cross-sectional view of a main part of a semiconductor device during a manufacturing process following FIG. 5.
Figure 8:
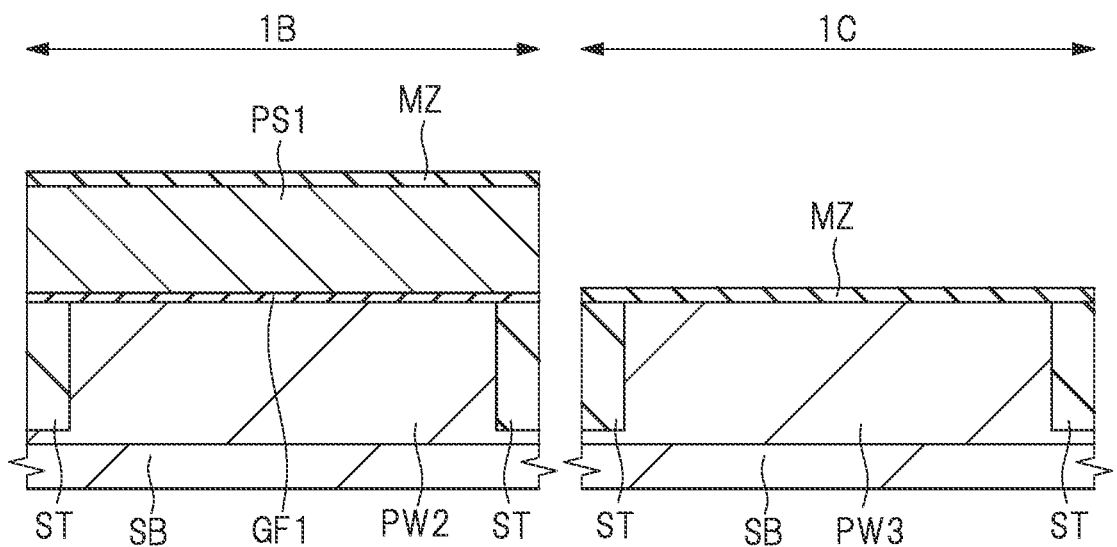
FIG. 8 is a cross-sectional view of a main part of the same semiconductor device as that in FIG. 7 during the manufacturing process.
Figure 9:
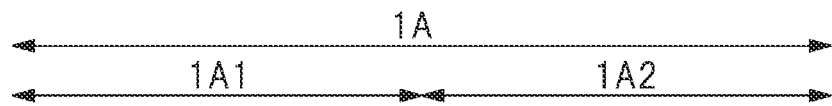
FIG. 9 is a cross-sectional view of a main part of a semiconductor device during a manufacturing process following FIG. 7.
Figure 9:
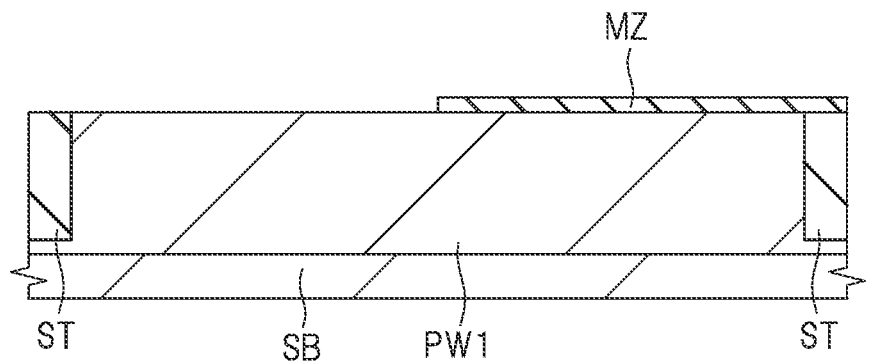
Figure 10:
FIG. 10 is a cross-sectional view of a main part of the same semiconductor device as that in FIG. 9 during the manufacturing process.
Figure 10:
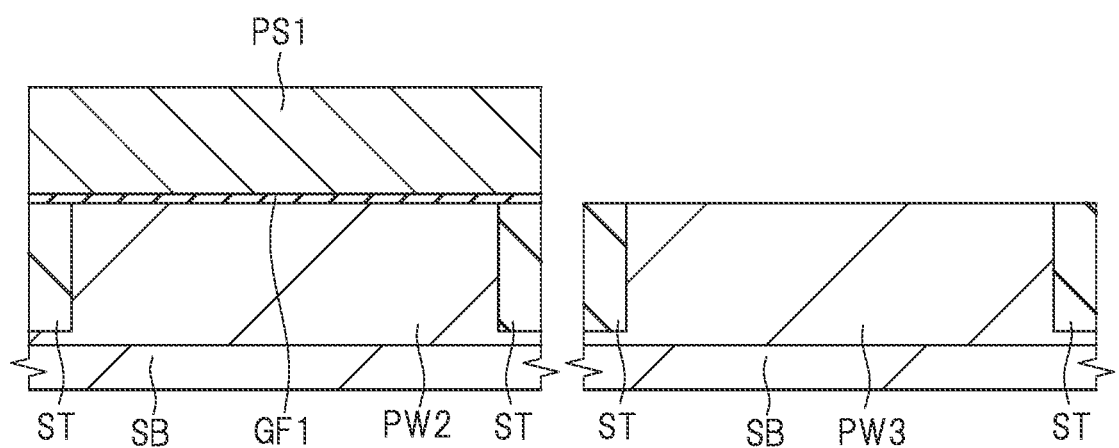
Figure 11:
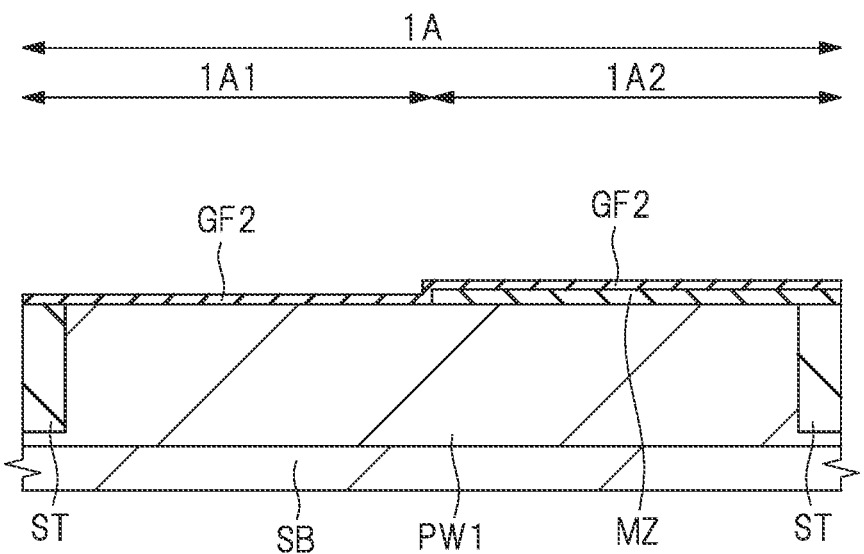
FIG. 11 is a cross-sectional view of a main part of a semiconductor device during a manufacturing process following FIG. 9.
Figure 12:
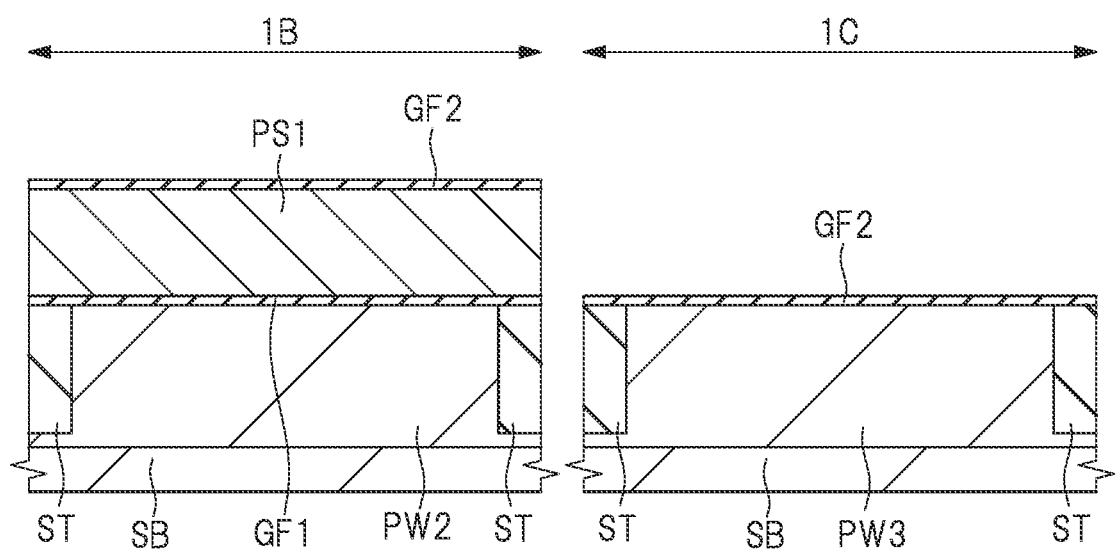
FIG. 12 is a cross-sectional view of a main part of the same semiconductor device as that in FIG. 11 during the manufacturing process.
Figure 13:
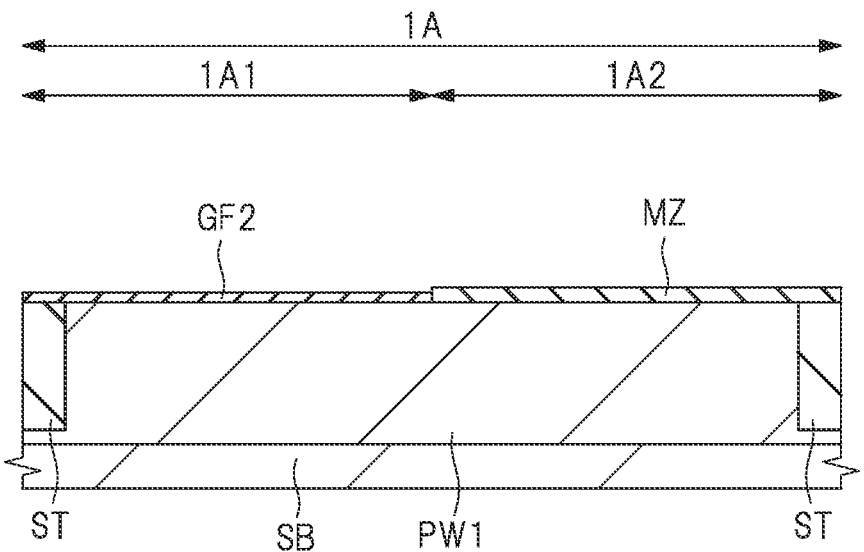
FIG. 13 is a cross-sectional view of a main part of a semiconductor device during a manufacturing process following FIG. 11.
Figure 14:
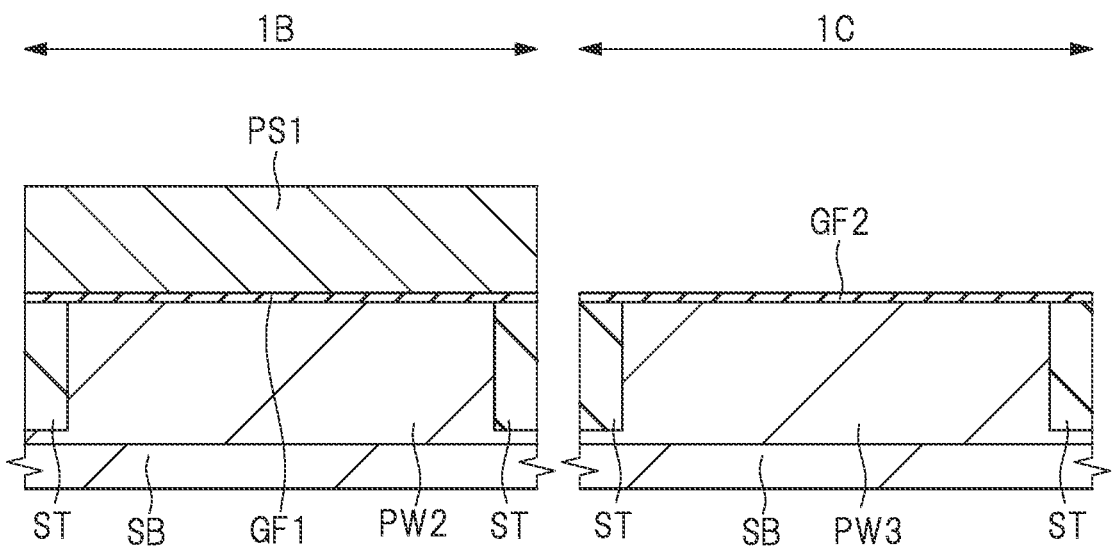
FIG. 14 is a cross-sectional view of a main part of the same semiconductor device as that in FIG. 13 during the manufacturing process.
Figure 15:
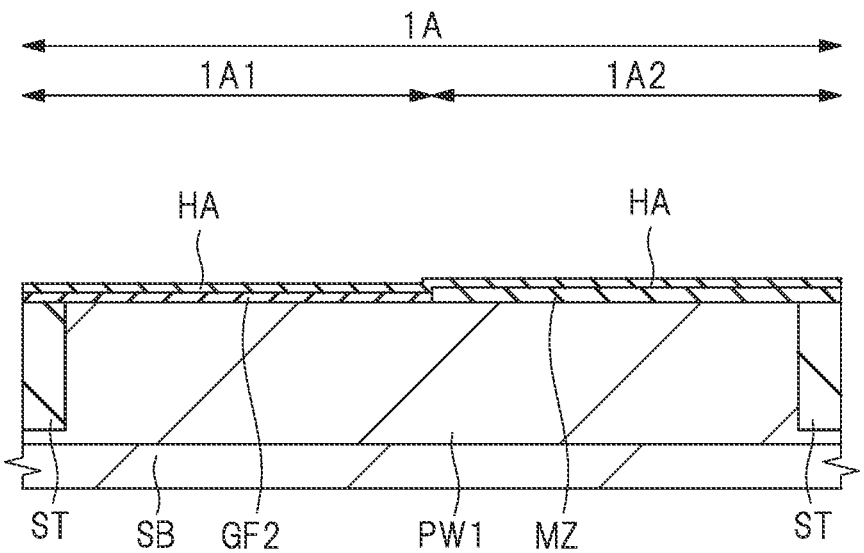
FIG. 15 is a cross-sectional view of a main part of a semiconductor device during a manufacturing process following FIG. 13.
Figure 16:
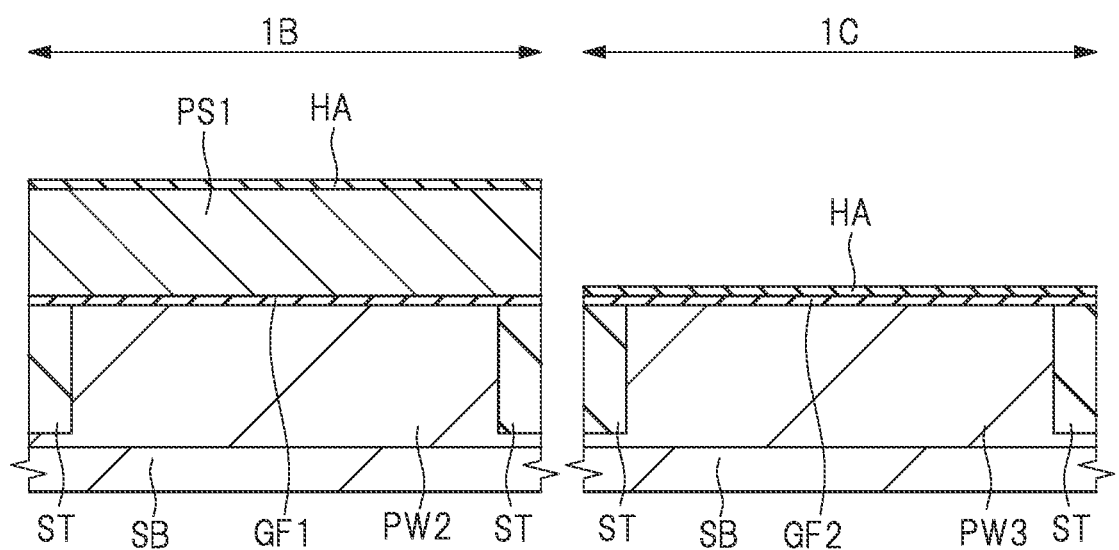
FIG. 16 is a cross-sectional view of a main part of the same semiconductor device as that in FIG. 15 during the manufacturing process.
Figure 17:
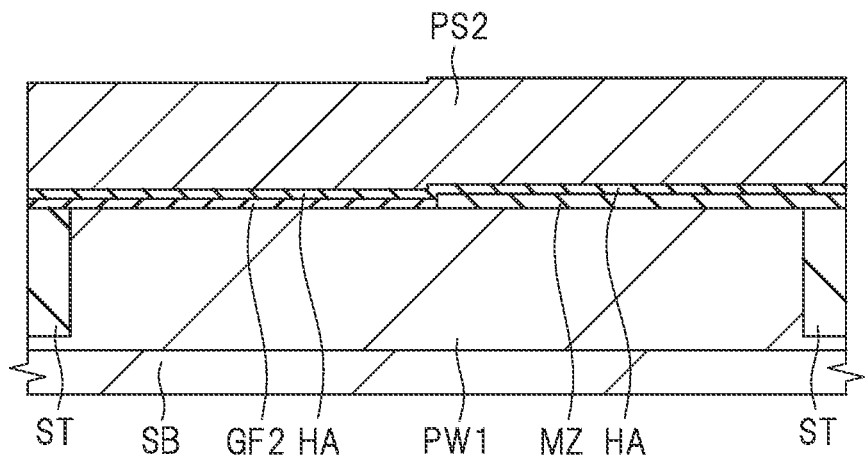
FIG. 17 is a cross-sectional view of a main part of a semiconductor device during a manufacturing process following FIG. 15.
Figure 18:
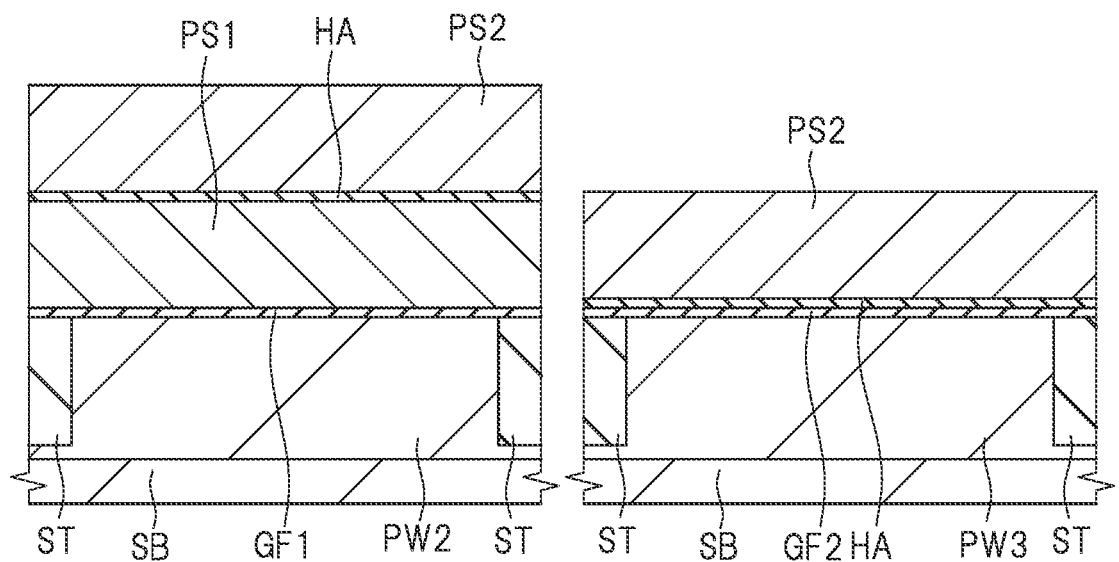
FIG. 18 is a cross-sectional view of a main part of the same semiconductor device as that in FIG. 17 during the manufacturing process.
Figure 19:
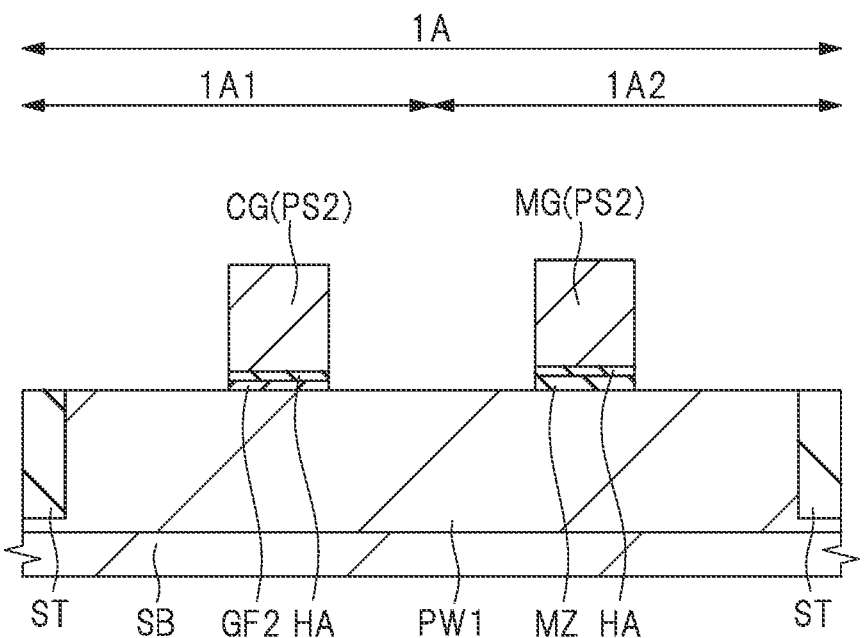
FIG. 19 is a cross-sectional view of a main part of a semiconductor device during a manufacturing process following FIG. 17.
Figure 20:
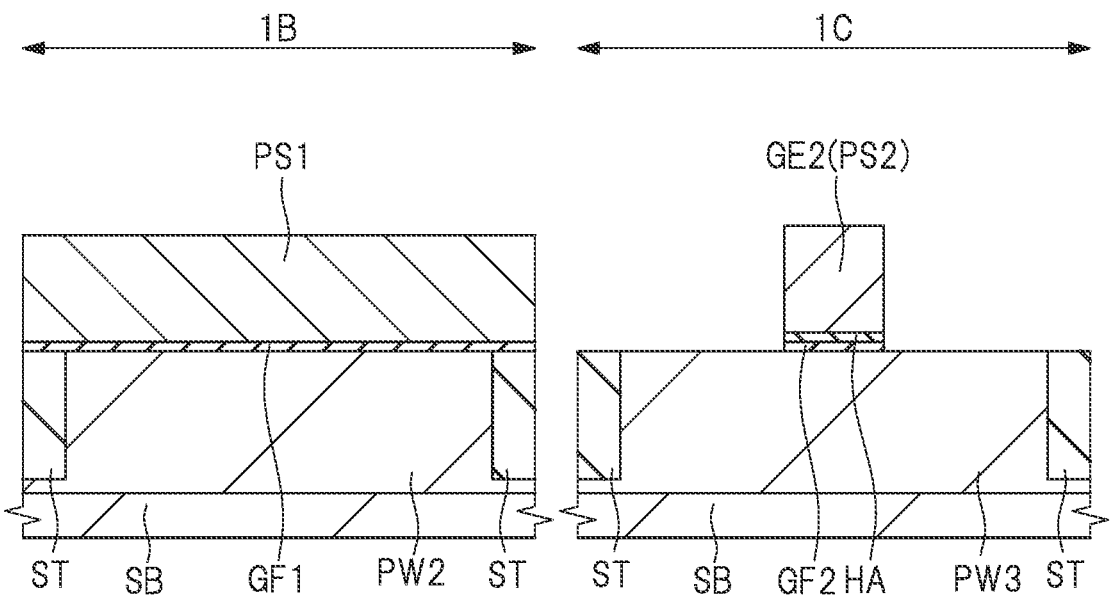
FIG. 20 is a cross-sectional view of a main part of the same semiconductor device as that in FIG. 19 during the manufacturing process.
Figure 21:
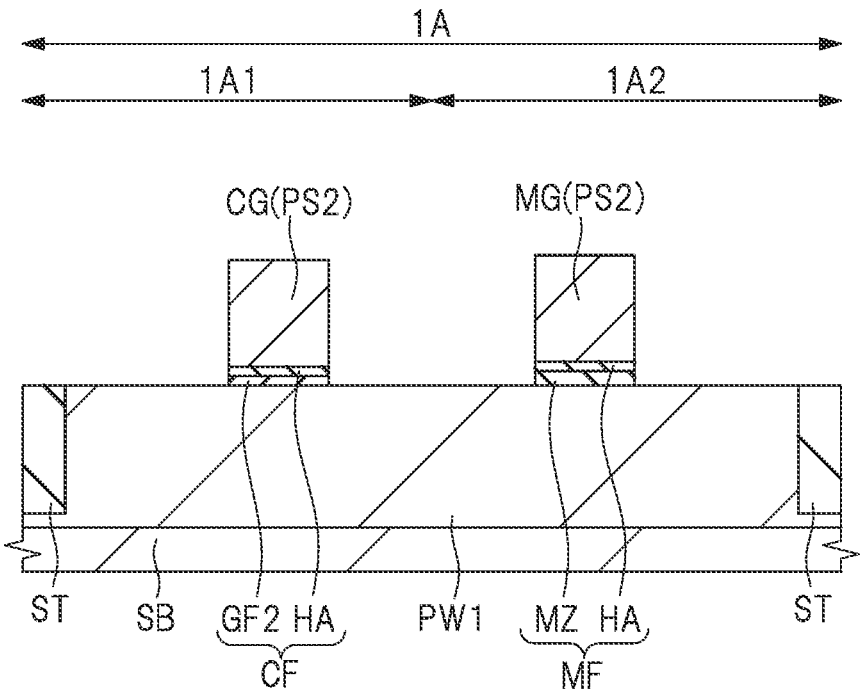
FIG. 21 is a cross-sectional view of a main part of a semiconductor device during a manufacturing process following FIG. 19.
Figure 22:
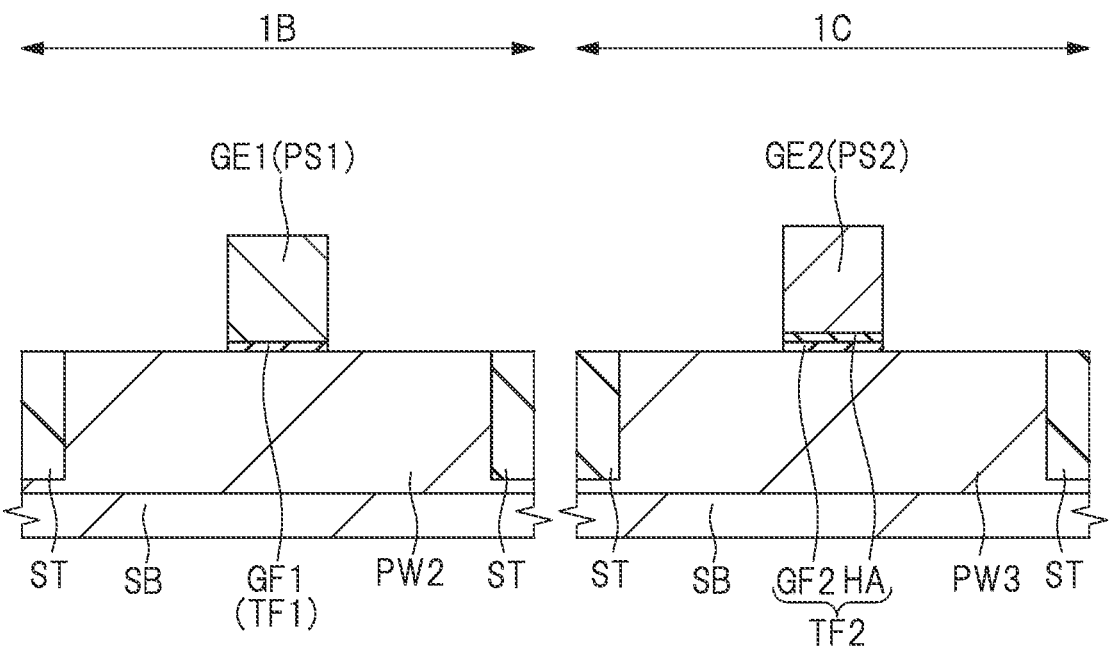
FIG. 22 is a cross-sectional view of a main part of the same semiconductor device as that in FIG. 21 during the manufacturing process.
Figure 23:
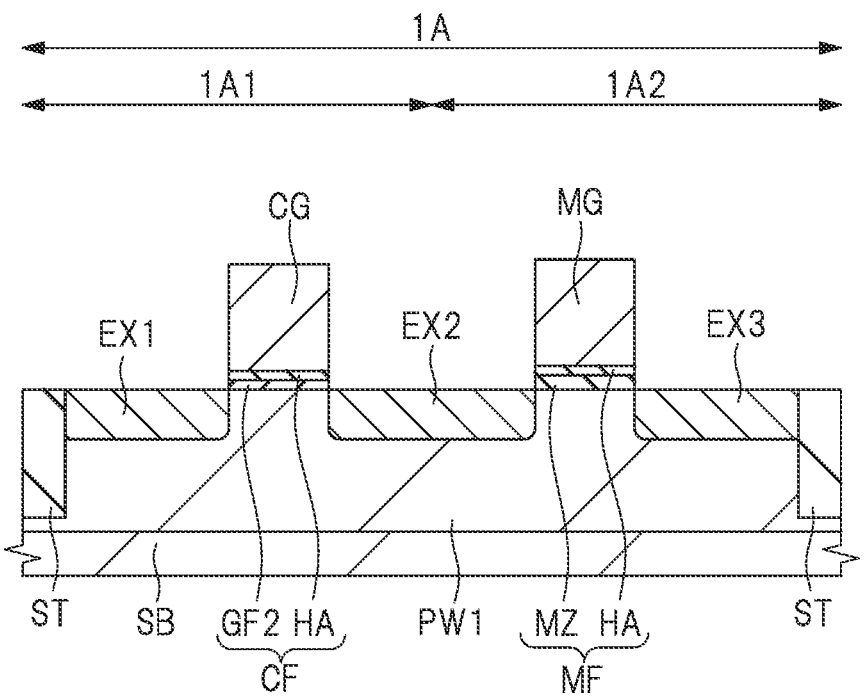
FIG. 23 is a cross-sectional view of a main part of a semiconductor device during a manufacturing process following FIG. 21.
Figure 24:
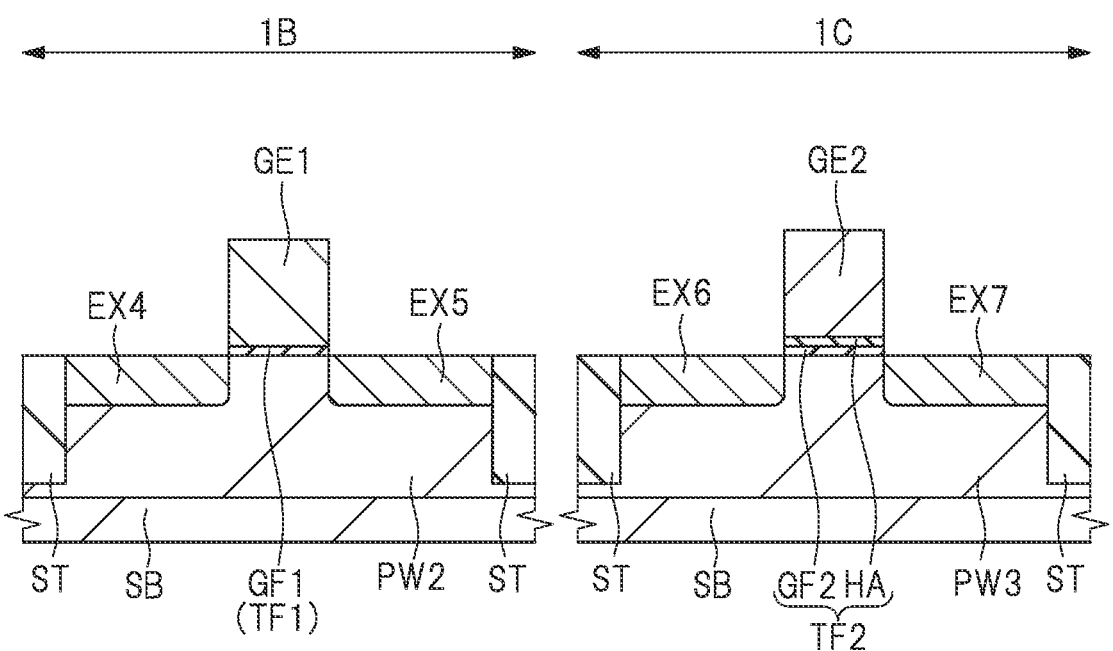
FIG. 24 is a cross-sectional view of a main part of the same semiconductor device as in FIG. 23 during the manufacturing process.
Figure 25:
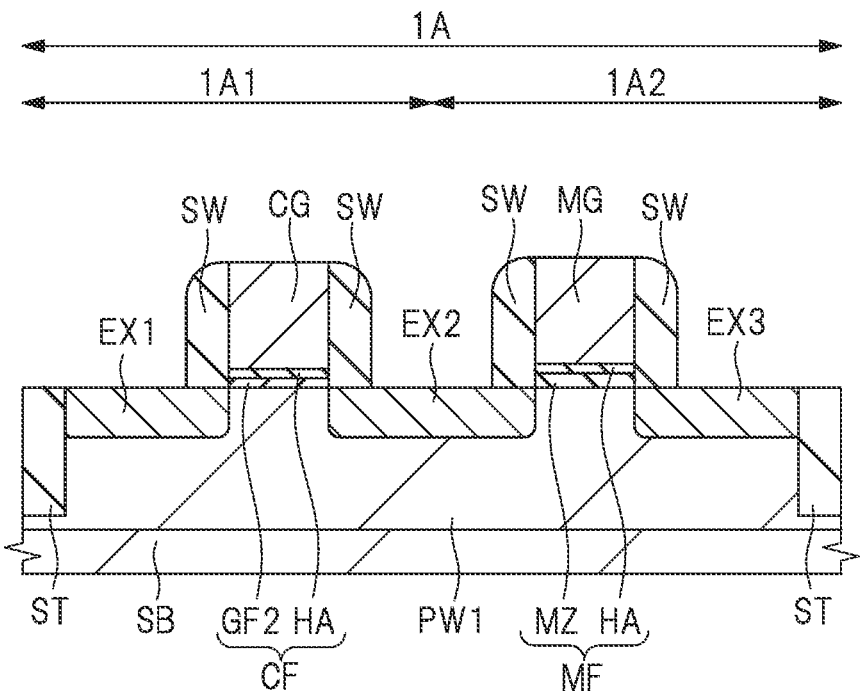
FIG. 25 is a cross-sectional view of a main part of a semiconductor device during a manufacturing process following FIG. 23.
Figure 26:
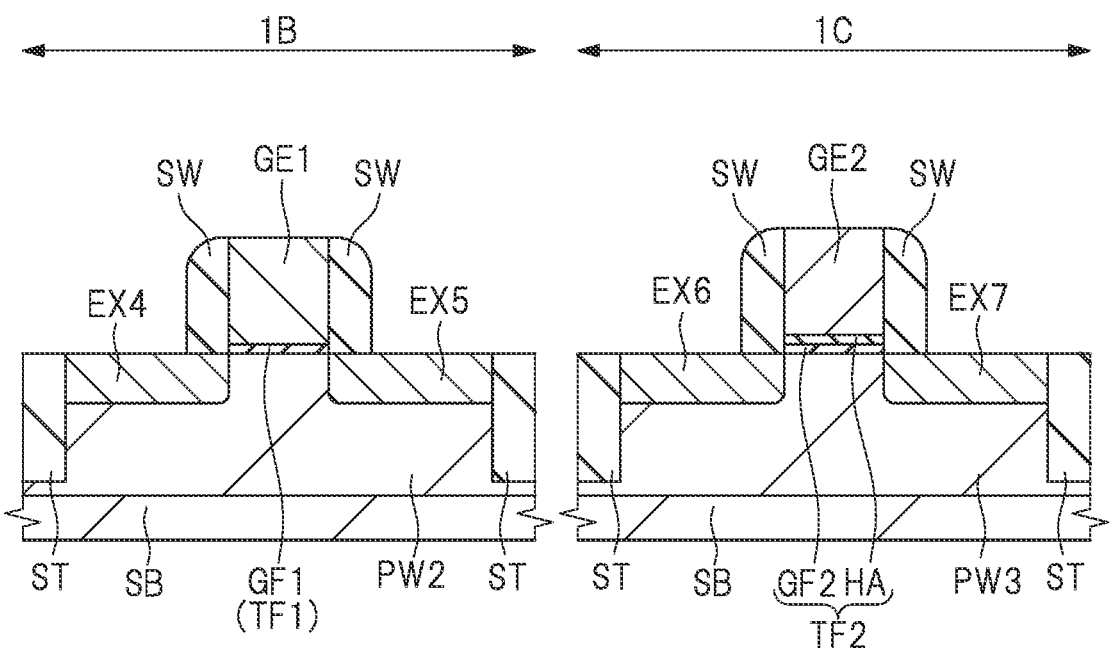
FIG. 26 is a cross-sectional view of a main part of the same semiconductor device as that in FIG. 25 during the manufacturing process.
Figure 27:
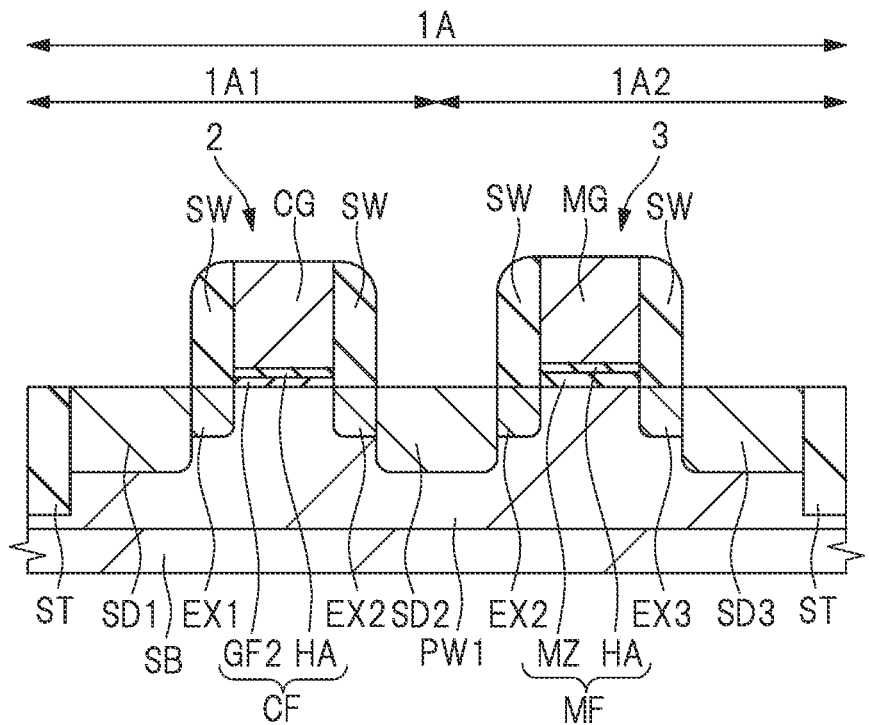
FIG. 27 is a cross-sectional view of a main part of a semiconductor device during a manufacturing process following FIG. 25.
Figure 28:
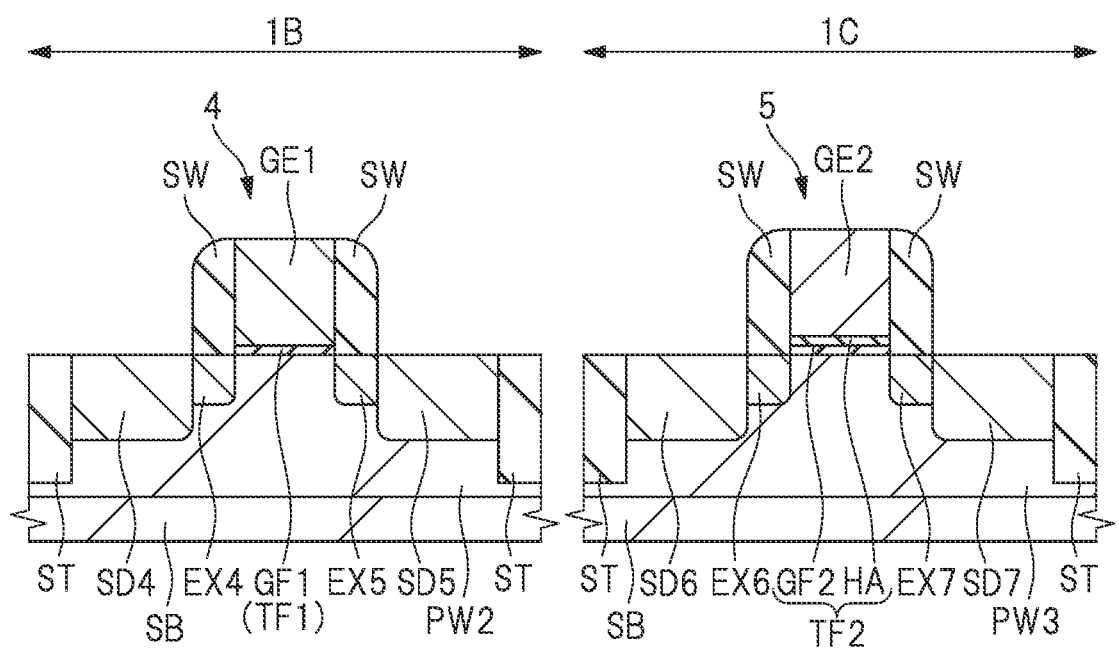
FIG. 28 is a cross-sectional view of a main part of the same semiconductor device as that in FIG. 27 during the manufacturing process.
Figure 29:
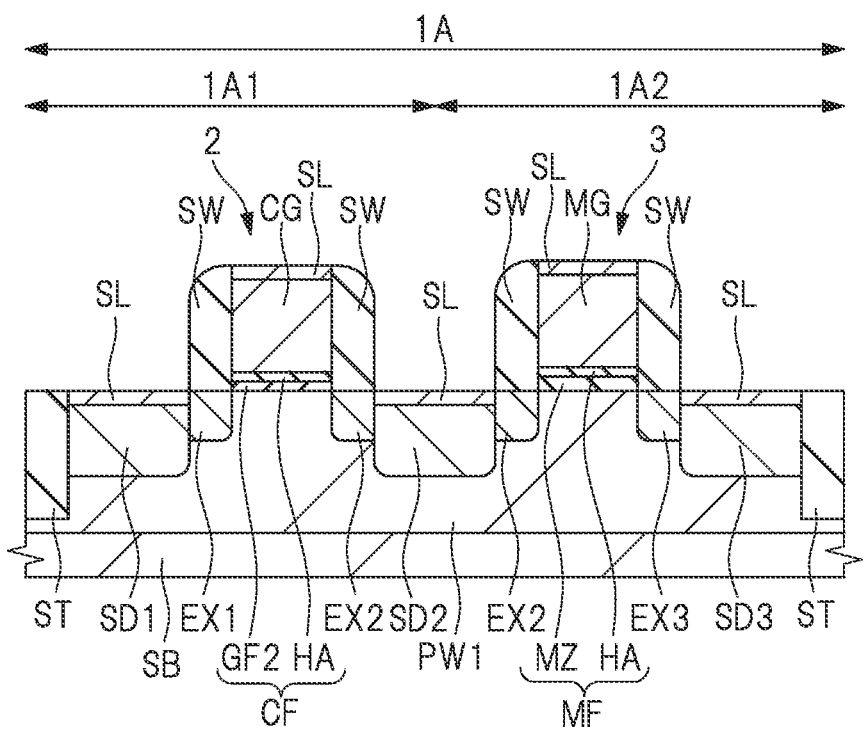
FIG. 29 is a cross-sectional view of a main part of a semiconductor device during a manufacturing process following FIG. 27.
Figure 30:
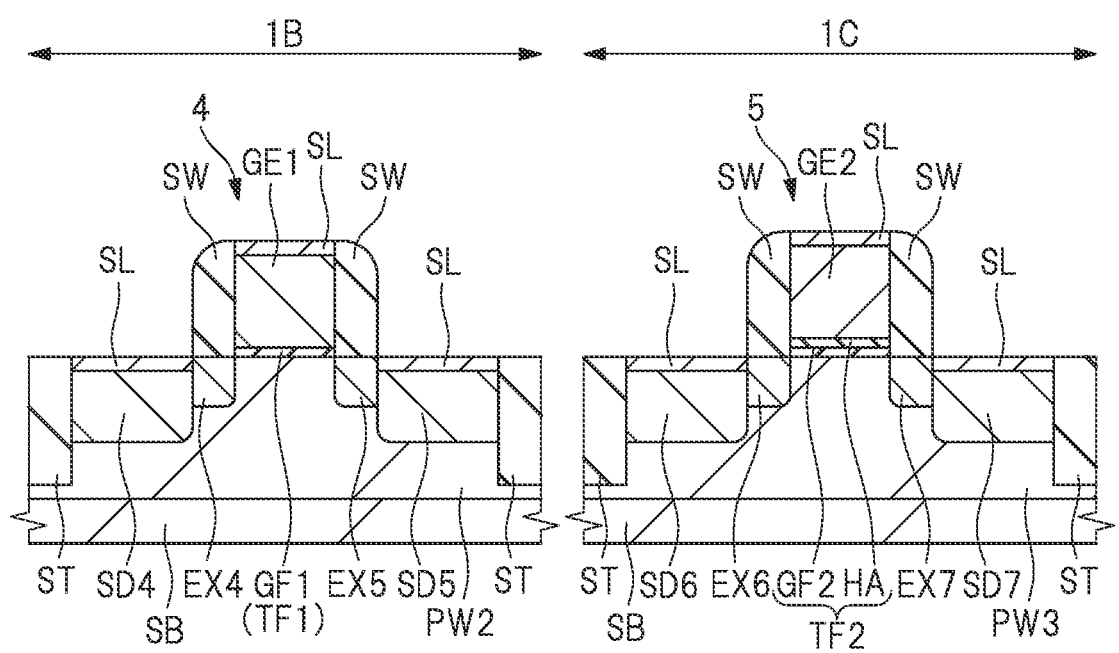
FIG. 30 is a cross-sectional view of a main part of the same semiconductor device as that in FIG. 29 during the manufacturing process.

A manufacturing process of a semiconductor device according to the present embodiment will be described with reference to the drawings. Each of FIGS. 1 to 32 is a cross-sectional view of a main part of a semiconductor device according to the present embodiment during a manufacturing process thereof. Each of FIGS. 1, 3, 5, 7, 9, 11, 13, 15, 17, 19, 21, 23, 25, 27, 29, and 31 shows a cross-sectional view of a main part of a memory cell region 1A. In addition, each of FIGS. 2, 4, 6, 8, 10, 12, 14, 16, 18, 20, 22, 24, 26, 28, 30, and 32 shows a cross-sectional view of each main part of a transistor forming region 1B and a transistor forming region 1C. Further, FIGS. 1 and 2 correspond to the same process stage; FIGS. 3 and 4 correspond to the same process stage; FIGS. 5 and 6 correspond to the same process stage; FIGS. 7 and 8 correspond to the same process stage; FIGS. 9 and 10 correspond to the same process stage; FIGS. 11 and 12 correspond to the same process stage; FIGS. 13 and 14 correspond to the same process stage; FIGS. 15 and 16 correspond to the same process stage; FIGS. 17 and 18 correspond to the same process stage; FIGS. 19 and 20 correspond to the same process stage; FIGS. 21 and 22 correspond to the same process stage; FIGS. 23 and 24 correspond to the same process stage; FIGS. 25 and 26 correspond to the same process stage; FIGS. 27 and 28 correspond to the same process stage; FIGS. 29 and 30 correspond to the same process stage; and FIGS. 30 and 31 correspond to the same process stage.

Here, a memory cell region 1A is a region in which a memory cell of a non-volatile memory is formed on or over a main surface of a semiconductor substrate SB. Further, a transistor forming region 1B is a region in which a transistor (corresponding to a MISFET 4 described later) having a gate insulating film containing no Hf is formed on or over the main surface of the semiconductor substrate SB. In addition, a transistor forming region 1C is a region in which a transistor (corresponding to a MISFET 5 described later) having a gate insulating film containing Hf is formed on or over the main surface of the semiconductor substrate SB. The memory cell region 1A, the transistor forming region 1B, and the transistor forming region 1C exist on the same semiconductor substrate SB. That is, the memory cell region 1A, the transistor forming region 1B, and the transistor forming region 1C correspond to plane regions different from one another on the main surface of the same semiconductor substrate SB. Further, the memory cell of the non-volatile memory is configured by a memory transistor and a control transistor that are connected in series. Therefore, a region of the memory cell region 1A, in which the control transistor is formed, is referred to as a control transistor forming region 1A1, and a region of the memory cell region 1A, in which the memory transistor is formed, is referred to as a memory transistor forming region 1A2. The control transistor forming region 1A1 and the memory transistor forming region 1A2 are adjacent to each other in a gate length direction (gate length direction of a memory gate electrode MG and a control gate electrode CG). The control transistor forming region 1A1 includes a region in which the control gate electrode CG is formed, and the memory transistor forming region 1A2 includes a region in which the memory gate electrode MG is formed. Incidentally, the memory transistor is a MISFET for storage, and the control transistor is a MISFET for memory cell selection.

In addition, both of a transistor (MISFET 4) formed in the transistor forming region 1B and a transistor (MISFET 5) formed in the transistor forming region 1C are MISFETs for peripheral circuit. Here, the peripheral circuit is a circuit other than the non-volatile memory and is, for example, a processor such as a CPU, a control circuit, a sense amplifier, a column decoder, a row decoder, an input/output circuit, and the like.

Incidentally, in the present embodiment, a case where each MISFET is an n-channel type MISFET will be described, but reversing a conductive type also makes it possible to form a p-channel type MISFET. Further, both an n-channel type MISFET and a p-channel type MISFET can also be formed.

Figure 2:
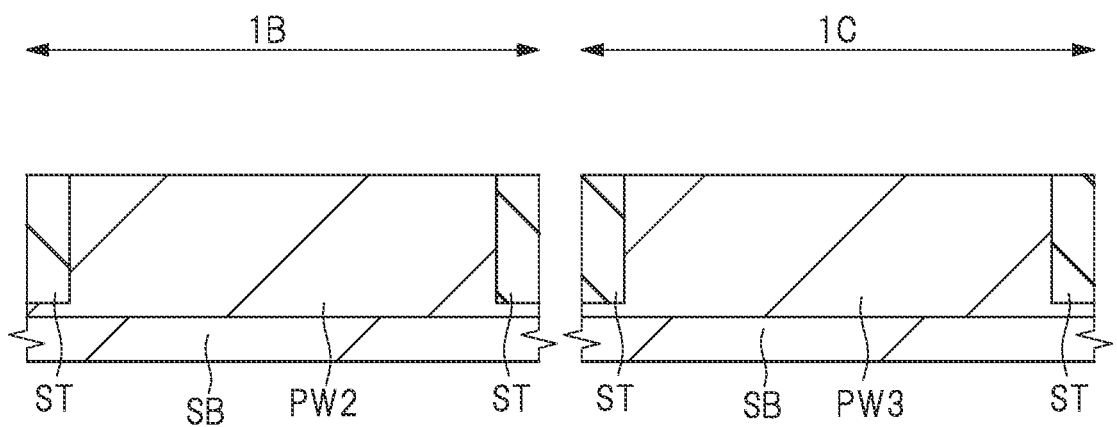
FIG. 2 is a cross-sectional view of a main part of the same semiconductor device as that in FIG. 1 during the manufacturing process.

As shown in FIGS. 1 and 2, first, a semiconductor substrate (semiconductor wafer) SB made of, for example, p-type single crystal silicon having a specific resistance of about 1 to 10 Ωcm is prepared (provided). Then, an element isolation region (inter-element separation insulating region) ST that defines (establishes) an active region is formed over the main surface of the semiconductor substrate SB.

The element isolation region ST is made of an insulator such as silicon oxide, and can be formed by, for example, an STI (Shallow Trench Isolation) method. For example, the element isolation region ST can be formed by forming a trench for element isolation on the main surface of the semiconductor substrate SB and then embedding an insulating film made of, for example, silicon oxide in the trench for element isolation.

Next, a p-type well PW1 is formed in the memory cell region 1A of the semiconductor substrate SB, a p-type well PW2 is formed in the transistor forming region 1B of the semiconductor substrate SB, and a p-type well PW3 is formed in the transistor forming region 1C of the semiconductor substrate SB. The p-type wells PW1, PW2, and PW3 can be formed by ion-implanting etc. a p-type impurity such as boron (B) into the semiconductor substrate SB. The p-type wells PW1, PW2, and PW3 are formed up to a predetermined depth from the main surface of the semiconductor substrate SB.

Next, as shown in FIGS. 3 and 4, an insulating film GF1 is formed over the main surface of the semiconductor substrate SB. The insulating film GF1 is an insulating film for gate insulating film of a MISFET 4 formed in the transistor forming region 1B. The insulating film GF1 is made of a material that contain no Hf (hafnium), for example, is made of a silicon oxide film etc., and can be formed by a thermal oxidation method, a CVD (Chemical Vapor Deposition) method, or the like. The insulating film GF1 is formed over: a surface of the semiconductor substrate SB in the memory cell region 1A (that is, on an upper surface of the p-type well PW1), a surface of the semiconductor substrate SB in the transistor forming region 1B (that is, on an upper surface of the p-type well PW2), and a surface of the semiconductor substrate SB in the transistor forming region 1C (that is, on an upper surface of the p-type well PW3). Further, although FIGS. 3 and 4 show a case where the insulating film GF1 is formed also on the element isolation region ST, a case where the insulating film GF1 is not formed on the element isolation region ST may also occur.

Next, a silicon film PS1 is formed over the main surface (the entire main surface) of the semiconductor substrate SB, that is, on the insulating film GF1. The silicon film PS1 is made of a polycrystalline silicon film and can be formed by a CVD method or the like. However, at a time of film formation, the silicon film PS1 is formed as an amorphous silicon film and, then, the amorphous silicon film can also be changed to a polycrystalline silicon film by a subsequent heat treatment. When n-type or p-type impurities are introduced into the silicon film PS1, the n-type or p-type impurities can be introduced during or after the film formation of the silicon film PS1. In the memory cell region 1A, the transistor forming region 1B. And the transistor forming region 1C, the silicon film PS1 is formed on the insulating film GF1. The silicon film PS1 is a conductive film for gate electrode of the MISFET 4 formed in the transistor forming region 1B.

Next, as shown in FIGS. 5 and 6, a photolithography technique and an etching technique are used to remove the silicon film PS1 and the insulating film GF1 in the memory cell region 1A and the silicon film PS1 and the insulating film GF1 in the transistor forming region 1C and to leave the silicon film PS1 and the insulating film GF1 in the transistor forming region 1B without removal. Specifically, after forming such a photoresist film (not shown) as to cover the silicon film PS1 in the transistor forming region 1B and expose the silicon film PS1 in the memory cell region 1A and the transistor forming region 1C, this photoresist film is used as an etching mask to etch the silicon film PS1. This makes it possible to selectively remove the silicon film PS1 and the insulating film GF1 in the memory cell region 1A and the transistor forming region 1C.

Next, as shown in FIGS. 7 and 8, an insulating film MZ is formed over the main surface (a surface) of the semiconductor substrate SB and on the surface (an upper surface and side surface) of the silicon film PS1. In the memory cell region 1A, the insulating film MZ is formed over the surface of the semiconductor substrate SB (that is, on the upper surface of the p-type well PW1). In the transistor forming region 1B, the insulating film MZ is formed on the surface of the silicon film PS1. In the transistor forming region 1C, the insulating film MZ is formed over the surface of the semiconductor substrate SB (that is, on an upper surface of the p-type well PW3).

The insulating film MZ is an insulating film for gate insulating film of a memory transistor 3 formed in (a memory transistor forming region 1A2 of) the memory cell region 1A, and is an insulating film having a charge storage portion (charge storage layer) inside. This insulating film MZ is composed of a laminated film (laminated insulating film) having an insulating film MZ1, an insulating film MZ2 formed on the insulating film MZ1, and an insulating film MZ3 formed on the insulating film MZ2. Each band gap of the insulating films MZ1 and MZ3 is larger than a band gap of the insulating film MZ2. Here, the insulating film MZ1 and the insulating film MZ3 can each be formed of a silicon oxide film, and the insulating film MZ2 can be formed of a silicon nitride film. The insulating film MZ is made of a material that contains no Hf (hafnium).

Incidentally, to make the drawings easier to see, in FIGS. 7 and 8, the insulating film MZ composed of the insulating film MZ1, the insulating film MZ2, and the insulating film MZ3 is simply illustrated as the insulating film MZ. However, in reality, as shown in an enlarged view of a region surrounded by a dotted circle in FIG. 7, the insulating film MZ is composed of a laminated film of the insulating film MZ1, the insulating film MZ2, and the insulating film MZ3.

To form the insulating film MZ, for example, the insulating film MZ1 made of a silicon oxide film is first formed by a thermal oxidation method; the insulating film MZ2 made of a silicon nitride film is then deposited on the insulating film MZ1 by a CVD method; and the insulating film MZ3 made of a silicon oxide film is further formed on the insulating film MZ2 by a CVD method, a thermal oxidation method, or both. This makes it possible to form the insulating film MZ having the insulating film MZ1 (silicon oxide film), the insulating film MZ2 (silicon nitride film), and the insulating film MZ3 (silicon oxide film).

Next, as shown in FIGS. 9 and 10, the photolithography technique and the etching technique are used to remove the insulating film MZ in the transistor forming regions 1B and 1C and the insulating film MZ in the control transistor forming region 1A1 of the memory cell region 1A and to leave the insulating film MZ in the memory transistor forming region 1A2 of the memory cell region 1A without removal. Specifically, for example, after forming such a photoresist film (not shown) as to expose the insulating film MZ in the transistor forming regions 1B and 1C and the insulating film MZ in the control transistor forming region 1A1 of the memory cell region 1A and cover the insulating film MZ in the memory transistor forming region 1A2 of the memory cell region 1A without removal, this photoresist film is used as an etching mask to etch the insulating film MZ. In the memory cell region 1A, the insulating film MZ is removed in the control transistor forming region 1A1 (therefore, in a to-be-formed region of a control gate electrode CG), and the insulating film MZ is left in the memory transistor forming region 1A2 (therefore, in a to-be-formed region of a memory gate electrode MG).

Next, as shown in FIGS. 11 and 12, an insulating film GF2 is formed over the main surface (a surface) of the semiconductor substrate SB and on the surface (upper surface and side surface) of the silicon film PS1. In the transistor forming region 1B, the insulating film GF2 is formed on the surface of the silicon film PS1. In the transistor forming region 1C, the insulating film GF2 is formed over the surface of the semiconductor substrate SB (that is, on the upper surface of the p-type well PW3). In the memory cell region 1A, the insulating film GF2 is formed over the surface of the semiconductor substrate SB (that is, on the upper surface of the p-type well PW1) in the control transistor forming region 1A1 (therefore, in a region where the insulating film MZ is not formed). In the memory cell region 1A, the insulating film GF2 is formed on the insulating film MZ in the memory transistor forming region 1A2 (therefore, in a region where the insulating film MZ is formed).

The insulating film GF2 is an insulating film for gate insulating film of a control transistor 2 formed in (the control transistor forming region 1A1 of) the memory cell region 1A, and is also an insulating film for gate insulating film of a MISFET 5 formed in the transistor forming region 1C. The insulating film GF2 is made of a material that contains no Hf (hafnium), for example, a silicon oxide film etc., and can be formed by a thermal oxidation method, a CVD method, or the like. Further, although FIGS. 11 and 12 show a case where the insulating film GF2 is also formed on the element isolation region ST, a case where the insulating film GF2 is not formed on the element isolation region ST may also occur.

Next, as shown in FIGS. 13 and 14, a photolithography technique and an etching technique are used to remove the insulating film GF2 formed on the insulating film MZ in the memory transistor forming region 1A2 of the memory cell region 1A and the insulating film GF2 formed on the silicon film PS1 in the transistor forming region 1B. At this time, the insulating film GF2 formed over the semiconductor substrate SB (on the p-type well PW1) in the control transistor forming region 1A1 (therefore, in a region in which the insulating film MZ is not formed) of the memory cell region 1A is left without removal.

This stage (stages of FIGS. 13 and 14) becomes such a state that, in the control transistor forming region 1A1 of the memory cell region 1A, the insulating film GF2 is formed over the semiconductor substrate SB (on the p-type well PW1) and that, in the memory transistor forming region 1A2 of the memory cell region 1A, the insulating film MZ is formed over the semiconductor substrate SB (on the p-type well PW1). Further, this stage (stages of FIGS. 13 and 14) becomes such a state that, in the transistor forming region 1B, the insulating film GF1 is formed over the semiconductor substrate SB (on the p-type well PW2) and the silicon film PS1 is formed on the insulating film GF1, and becomes such a state that, in the transistor forming region 1C, the insulating film GF2 is formed over the semiconductor substrate SB (on the p-type well PW3).

Next, as shown in FIGS. 15 and 16, an Hf-containing film HA is formed over the entire main surface of the semiconductor substrate SB. The Hf-containing film HA is made of a material containing Hf (hafnium). As the Hf-containing film HA, a hafnium oxide film or a hafnium film (Hf film) can be preferably used, and a hafnium film (Hf film) is particularly preferable. The Hf-containing film HA can preferably be formed by a sputtering method.

In the control transistor forming region 1A1 of the memory cell region 1A, the Hf-containing film HA is formed on the insulating film GF2. In the memory transistor forming region 1A2 of the memory cell region 1A, the Hf-containing film HA is formed on the insulating film MZ. In the transistor forming region 1B, the Hf-containing film HA is formed on the silicon film PS1. In the transistor forming region 1C, the Hf-containing film HA is formed on the insulating film GF2. The Hf-containing film HA is used to adjust threshold voltages of the control transistor 2, the memory transistor 3, and the MISFET 5 (to increase absolute values of the threshold voltages).

Incidentally, in the present embodiment, a case where Hf (hafnium) has been applied as an element introduced into the gate insulating film in order to adjust the threshold voltage of the transistor (increase the absolute value of the threshold voltage) is described. For this reason, the Hf-containing film HA is used. However, introducing Al (aluminum) or Zr (zirconium) into the gate insulating film also makes it possible to adjust the threshold voltage of the transistor (increase the absolute value of the threshold voltage. Therefore, in the present embodiment and the following second and third embodiments, an Al-containing film or a Zr-containing film can also be used instead of the Hf-containing film HA. The Al-containing film is made of a material containing Al (aluminum), and an aluminum oxide film or an aluminum film (Al film) can be preferably used. Further, the Zr-containing film is made of a material containing Zr (zirconium), and a zirconium oxide film or a zirconium film (Zr film) can be preferably used. In this way, as an element introduced into the gate insulating film in order to adjust the threshold voltage of the transistor (increase the absolute value of the threshold voltage), Hf (hafnium), Al (aluminum) or Zr (zirconium) is preferable, and Hf (hafnium) is most preferable.

Next, as shown in FIGS. 17 and 18, a silicon film PS2 is formed over the main surface (entire main surface) of the semiconductor substrate SB, that is, on the Hf-containing film HA. The silicon film PS2 is made of a polycrystalline silicon film and can be formed by a CVD method or the like. However, at the time of the film formation, the silicon film PS2 is formed as an amorphous silicon film and, then, the amorphous silicon film can also be changed to a polycrystalline silicon film by a subsequent heat treatment. When n-type or p-type impurities are introduced into the silicon film PS2, the n-type or p-type impurities can be introduced during or after the film formation of the silicon film PS2. In the memory cell region 1A, the transistor forming region 1B, and the transistor forming region 1C, the silicon film PS2 is formed on the Hf-containing film HA. The silicon film PS2 combines a conductive film for gate electrode of the control transistor 2 formed in the memory cell region 1A, a conductive film for gate electrode of the memory transistor 3 formed in the memory cell region 1A, and a conductive film for gate electrode of the MISFET 5 formed in the transistor forming region 1C.

Next, as shown in FIGS. 19 and 20, by using a photolithography technique and an etching technique to pattern the silicon film PS2, the control gate electrode CG, the memory gate electrode MG, and a gate electrode GF2 that are each composed of the patterned silicon film PS2 are formed. At this time, the silicon film PS2 in the transistor forming region 1B is removed; the control gate electrode CG is formed in the control transistor forming region 1A1 of the memory cell region 1A; the memory gate electrode MG is formed in the memory transistor forming region 1A2 of the memory cell region 1A; and the gate electrode GE2 is formed in the transistor forming region 1C.

In the control transistor forming region 1A1 of the memory cell region 1A, the Hf-containing film HA and the insulating film GF2 other than a portion covered with the control gate electrode CG can be removed by dry etching performed in a patterning step of the silicon film PS2 or wet etching performed after the dry etching. Further, in the memory transistor forming region 1A2 of the memory cell region 1A, the Hf-containing film HA and the insulating film MZ other than a portion covered with the memory gate electrode MG can be removed by dry etching performed in a patterning step of the silicon film PS2 or wet etching performed after the dry etching. In addition, in the transistor forming region 1C, the Hf-containing film HA and the insulating film GF2 other than a portion covered with the gate electrode GE2 can be removed by dry etching performed in a patterning step of the silicon film PS2 or wet etching after the dry etching. Moreover, in the transistor forming region 1B, the silicon film PS2 is removed in a patterning step of the silicon film PS2. Furthermore, in the transistor forming region 1B, the Hf-containing film HA can be removed by dry etching performed in a patterning step of the silicon film PS2 or wet etching after the dry etching.

In the control transistor forming region 1A1 of the memory cell region 1A, the insulating film GF2 and the Hf-containing film HA under the control gate electrode CG remain without being etched and become (serves as) a gate insulating film CF of the control transistor 2. In the control transistor forming region 1A1 of the memory cell region 1A, the control gate electrode CG is formed over the semiconductor substrate SB (on the p-type well PW1) via the gate insulating film CF composed of the insulating film GF2 and the Hf-containing film HA. Further, in the memory transistor forming region 1A2 of the memory cell region 1A, the insulating film MZ and the Hf-containing film HA under the memory gate electrode MG remain without being etched and become a gate insulating film MF of the memory transistor 3. The gate insulating film MF is a gate insulating film having a charge storage portion (corresponding to the above-mentioned insulating film MZ2). In the memory transistor forming region 1A2 of the memory cell region 1A, the memory gate electrode MG is formed over the semiconductor substrate SB (on the p-type well PW1) via the gate insulating film MF composed of the insulating film MZ and the Hf-containing film HA. In addition, in the transistor forming region 1C, the insulating film GF2 and the Hf-containing film HA under the gate electrode GE2 remain without being etched, and become a gate insulating film TF2 of the MISFET 5 having the gate electrode GE2. In the transistor forming region 1C, the gate electrode GE2 is formed over the semiconductor substrate SB (on the p-type well PW3) via the gate insulating film TF2 composed of the insulating film GF2 and the Hf-containing film HA.

Next, as shown in FIGS. 21 and 22, by using a photolithography technique and an etching technique to pattern the silicon film PS1 in the transistor forming region 1B, the gate electrode GE1 composed of the patterned silicon film PS1 is formed. At this time, since the memory cell region 1A and the transistor forming region 1C are covered with a photoresist film (not shown), the semiconductor substrate SB (p-type well PW1), the control gate electrode CG, and the memory gate electrode MG in the memory cell region 1A and the semiconductor substrate SB (p-type well PW2) and the gate electrode GE2 in the transistor forming region 1C are not etched. The gate electrode GE1 is formed in the transistor forming region 1B.

In the transistor forming region 1B, the insulating film GF1 under the gate electrode GE1 remains without being etched, and becomes a gate insulating film TF1 of the MISFET having the gate electrode GE1. In the transistor forming region 1B, the gate electrode GE1 is formed over the semiconductor substrate SB (on the p-type well PW2) via the gate insulating film TF1 composed of the insulating film GF1.

In this way, a structure of FIGS. 21 and 22 is obtained. In FIG. 21, in the memory transistor forming region 1A2 of the memory cell region 1A, the memory gate electrode MG is formed over the semiconductor substrate SB (on the p-type well PW1) via the gate insulating film MF and, in the control transistor forming region 1A1 of the memory cell region 1A, the control gate electrode CG is formed over the semiconductor substrate SB (on the p-type well PW1) via the gate insulating film CF. Further, in FIG. 22, in the transistor forming region 1B, the gate electrode GE1 is formed over the semiconductor substrate SB (on the p-type well PW2) via the gate insulating film TF1 and, in the transistor forming region 1C, the gate electrode GE2 is formed over the semiconductor substrate SB (on the p-type well PW3) via the gate insulating film TF2.

The Hf-containing film HA contains Hf (hafnium), and the insulating films GF1 and GF2 do not contain Hf (hafnium). Therefore, the gate insulating films CF, MF, and TF2 formed over the semiconductor substrates SB (on the p-type wells PW1 and PW3) in the memory cell region 1A and the transistor forming region 1C are all gates insulating films containing Hf (hafnium). The gate insulating film TF1, which is formed over the semiconductor substrate SB (on the p-type well PW2) in the transistor forming region 1B, is a gate insulating film containing no Hf (hafnium).

Next, as shown in FIGS. 23 and 24, $n^+$ type semiconductor regions (impurity diffusion layers) EX1, EX2, EX3, EX4, EX5, EX6, and EX7 are formed by an ion implantation method or the like. Specifically, by using the control gate electrode CG, memory gate electrode MG, gate electrode GE1, and gate electrode GE2 as masks (ion implantation blocking masks) to ion-inject an n-type impurity such as arsenic (As) or phosphorus (P) into the semiconductor substrate SB (p-type wells PW1, PW2, PW3), the $n^-$ type semiconductor regions EX1, EX2, EX3, EX4, EX5, EX6, and EX7 can be formed.

In the memory cell region 1A, the $n^-$ type semiconductor regions EX1 and EX2 are formed on both sides of the control gate electrode CG over the semiconductor substrate SB (on the p-type well PW1), and the $n^-$ type semiconductor regions EX2 and EX3 are formed on both sides of the memory gate electrode MG over the semiconductor substrate SB (on the p-type well PW1). Incidentally, the $n^-$ type semiconductor region EX2 is formed between the control gate electrode CG and the memory gate electrode MG over the semiconductor substrate SB (on the p-type well PW1). Further, in the transistor forming region 1B, the $n^-$ type semiconductor regions EX4 and EX5 are formed on both sides of the gate electrode GE1 over the semiconductor substrates SB (on the p-type well PW2). In addition, in the transistor forming region 1C, the $n^-$ type semiconductor regions EX6 and EX7 are formed on both sides of the gate electrode GE2 over the semiconductor substrate SB (on the p-type well PW3).

Next, an insulating film (for example, a silicon oxide film) is formed over the main surface of the semiconductor substrate SB so as to cover the control gate electrode CG, the memory gate electrode MG, the gate electrode GE1 and the gate electrode GE2, and then the insulating film thereof is etched back to form sidewall spacers SW as shown in FIGS. 25 and 26. The sidewall spacers SW are formed on the both side walls of each of the control gate electrode CG, the memory gate electrode MG, the gate electrode GE1 and the gate electrode GE2.

Next, as shown in FIGS. 27 and 28, n$^+$ type semiconductor regions (impurity diffusion layers) SD1, SD2, SD3, SD4, SD5, SD6, and SD7 are formed by using an ion implantation method or the like. Specifically, by using the control gate electrode CG, the memory gate electrode MG, the gate electrode GE1, and the gate electrode GE2 and the sidewall spacers SW on their side walls as masks to ion-injecting an n-type impurity such as arsenic (As) or phosphorus (P) into the semiconductor substrate SB (p-type wells PW1, PW2, PW3), the n$^+$ type semiconductor regions SD1 to SD7 can be formed. Impurity concentration of the n$^+$ type semiconductor regions SD1, SD2 and SD3 is higher than impurity concentration of the n$^-$ type semiconductor regions EX1, EX2 and EX3 which are LDD (lightly doped drain) regions. Further, impurity concentration of the n$^+$ type semiconductor regions SD4 and SD5 is higher than impurity concentration of the n$^-$ type semiconductor regions EX4 and EX5 which are LDD regions. In addition, impurity concentration of the n$^+$ type semiconductor regions SD6 and SD7 is higher than the impurity concentration of the n$^-$ type semiconductor regions EX6 and EX7 which are LDD regions.

In the memory cell region 1A, the n, type semiconductor regions SD1 and SD2 are formed over the semiconductor substrates SB (in the p-type well PW1) on both sides of a structure including the control gate electrode CG and the sidewall spacer SW on the side wall thereof, and the n$^+$ type semiconductor regions SD2 and SD3 are formed over the semiconductor substrate SB (in the p-type well PW1) on both sides of a structure including the memory gate electrode MG and the sidewall spacer SW on the side wall thereof. Incidentally, the n$^+$ type semiconductor region SD2 is formed between the control gate electrode CG and the memory gate electrode MG over the semiconductor substrate SB (in the p-type well PW1). Further, in the transistor forming region 1B, the n$^+$ type semiconductor regions SD4 and SD5 are formed over the semiconductor substrate SB (in the p-type wells PW2) on both sides of a structure including the gate electrode GE1 and the sidewall spacer SW on the side wall thereof. In addition, in the transistor forming region 1C, the n$^+$ type semiconductor regions SD6 and SD7 are formed over the semiconductor substrate SB (in the p-type well PW3) on both sides of a structure including the gate electrode GE2 and the sidewall spacer SW on the side wall thereof.

Next, activation annealing, which is a heat treatment for activating the impurities introduced so far, is performed.

In this way, the control transistor 2, the memory transistor 3, the MISFET 4 and the MISFET 5 are formed. The control transistor 2 and the memory transistor 3 are formed in the memory cell region 1A, the MISFET 4 is formed in the transistor forming region 1B, and the MISFET 5 is formed in the transistor forming region 1C.

The control transistor 2 includes: a control gate electrode CG; a gate insulating film CF interposed between the control gate electrode CG and the semiconductor substrate SB (p-type well PW1); and n$^+$ type semiconductor regions SD1 and SD2 for source/drain (source or drain). The memory transistor 3 includes: a memory gate electrode MG; agate insulating film MF interposed between the memory gate electrode MG and the semiconductor substrate SB (p-type well PW1); and n$^+$ type semiconductor regions SD2 and SD3 for source/drain. However, the control transistor 2 and the memory transistor 3 share the n$^+$ type semiconductor region SD2 and become connected in series. That is, in a plan view, the control gate electrode CG is located between the n$^+$ type semiconductor region SD1 and the n-type semiconductor region SD2, and the memory gate electrode MG is located between the n$^+$ type semiconductor region SD2 and the n$^+$ type semiconductor region SD3. The control gate electrode CG is formed between the n$^+$ type semiconductor region SD1 and the n$^+$ type semiconductor region SD2 via the gate insulating film CF over the semiconductor substrate SB (on the p-type well PW1). The memory gate electrode MG is formed between the n$^+$ semiconductor region SD2 and the n$^+$ semiconductor region SD3 via the gate insulating film MF over the semiconductor substrate SB (on the p-type well PW1). The memory cell of the non-volatile memory is formed by the control transistor 2 and the memory transistor 3.

The MISFET 4 has: a gate electrode GE1; a gate insulating film TF1 interposed between the gate electrode GE1 and the semiconductor substrate SB (p-type well PW2); and n$^+$ type semiconductor regions SD4 and SD5 for source/drain. The gate electrode GE1 is formed between the n$^+$ type semiconductor region SD4 and the n$^+$ type semiconductor region SD5 via the gate insulating film TF1 over a semiconductor substrate SB (in the p-type well PW2). The MISFET 5 has: a gate electrode GE2; a gate insulating film TF2 interposed between the gate electrode GE2 and the semiconductor substrate SB (p-type well PW3); and n$^+$ type semiconductor regions SD6 and SD7 for source/drain. The gate electrode GE2 is formed between the n$^+$ type semiconductor region SD6 and the n$^+$ type semiconductor region SD7 via the gate insulating film TF2 over the semiconductor substrate SB (in the p-type well PW3). The gate insulating films CF, MF, and TF2 are all gate insulating films containing Hf (hafnium), and the gate insulating film TF1 is a gate insulating film containing no Hf (hafnium). From another point of view, the gate insulating films CF, MF, and TF2 are all gate insulating films in which Hf (hafnium) is introduced, and the gate insulating film TF1 is a gate insulating film in which Hf (hafnium) is not introduced.

Incidentally, when an Al-containing film is used instead of the Hf-containing film HA, the gate insulating films CF, MF, and TF2 all become gate insulating films containing Al (aluminum), and the gate insulating film TF1 becomes a gate insulating film containing no Al (aluminum). From another point of view, when the Al-containing film is used instead of the Hf-containing film HA, the gate insulating films CF, MF, and TF2 all becomes gate insulating films in which Al (aluminum) is introduced, and the gate insulating film TF1 becomes a gate insulating film into which Al (aluminum) is not introduced. Further, when a Zr-containing film is used instead of the Hf-containing film HA, the gate insulating films CF, MF, and TF2 all become gate insulating films containing Zr (zirconium), and the gate insulating film TF1 becomes a gate insulating film containing no Zr (zirconium). From another point of view, when the Zr-containing film is used instead of the Hf-containing film HA, the gate insulating films CF, MF, and TF2 all become gate insulating films into which Zr (zirconium) is introduced, and the gate insulating film TF1 becomes a gate insulating film into which Zr (zirconium) is not introduced.

Next, a salicide technique is used to form a metal silicid layer SL as shown in FIGS. 29 and 30. The metal silicide layer SL can be formed on each upper portion of the n$^+$ type semiconductor regions SD1, SD2, SD3, SD4, SD5, SD6, and SD7, the control gate electrode CC, the memory gate electrode MG, the gate electrode GE1 and the gate electrode GE2.

Figure 31:
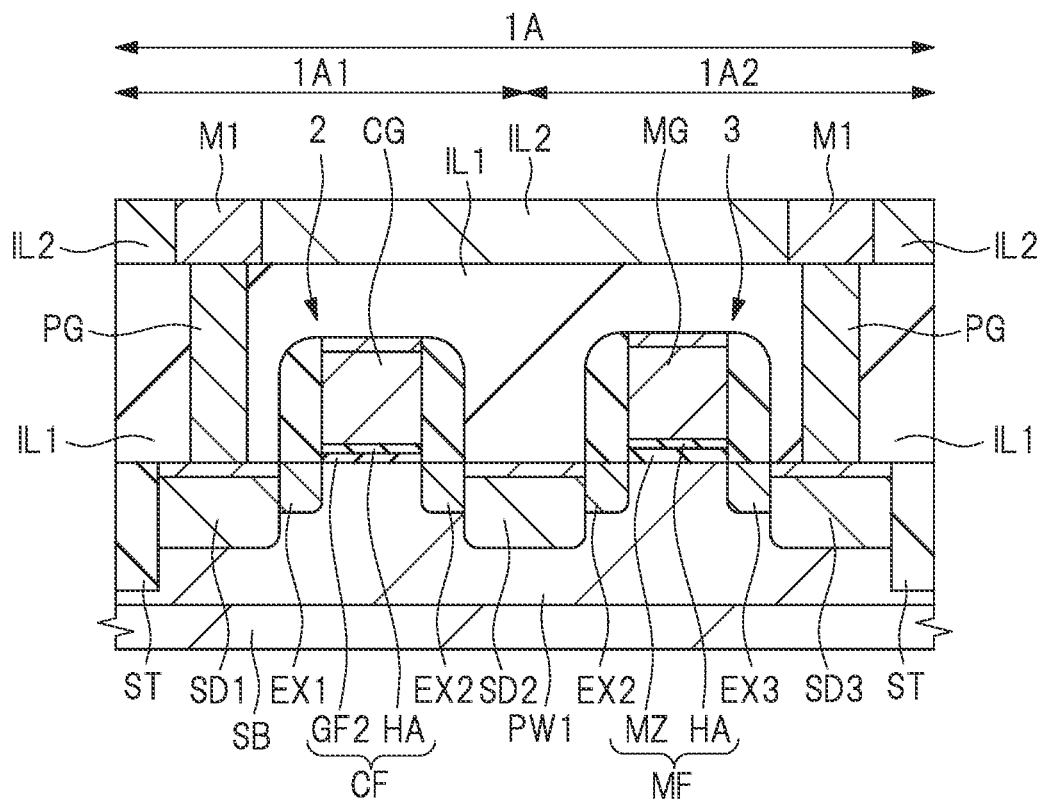
FIG. 31 is a cross-sectional view of a main part of a semiconductor device during a manufacturing process following FIG. 29.
Figure 32:
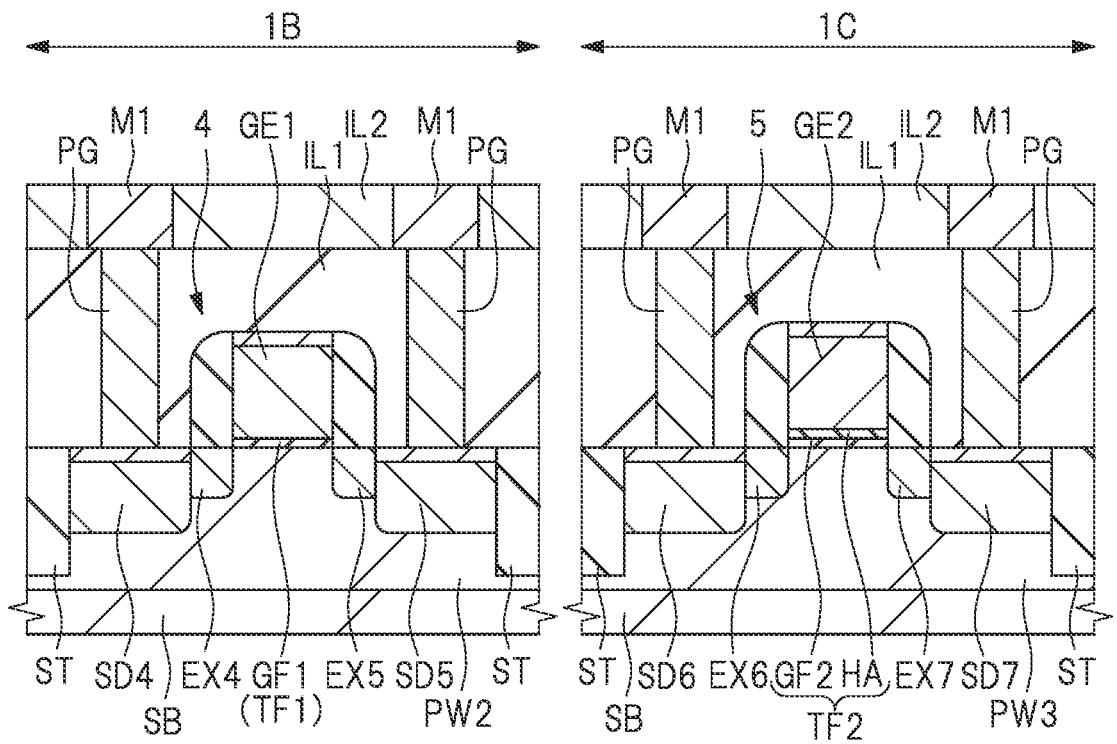
FIG. 32 is a cross-sectional view of a main part of the same semiconductor device as that in FIG. 31 during the manufacturing process.
Figure 33:
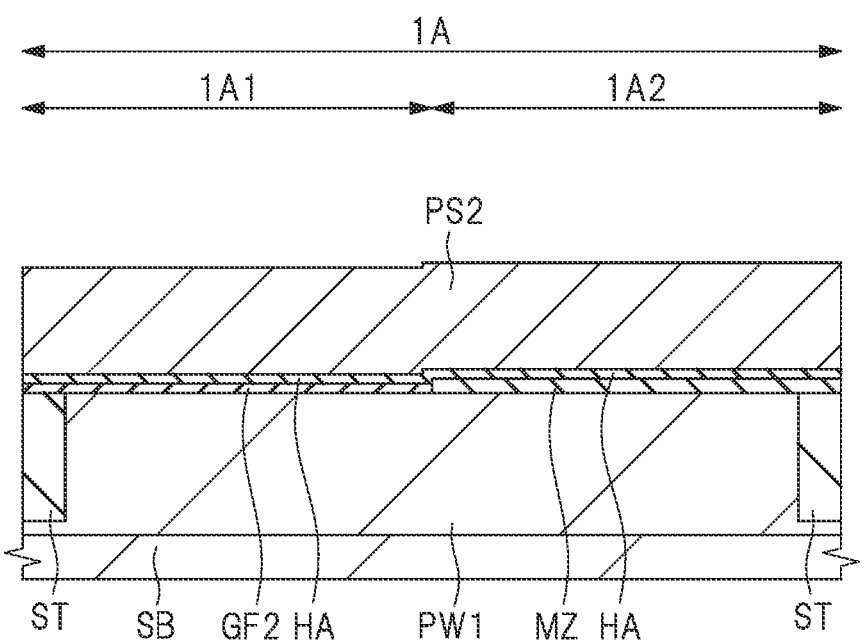
FIG. 33 is a cross-sectional view of a main part of a semiconductor device according to another embodiment during a manufacturing process.
Figure 34:
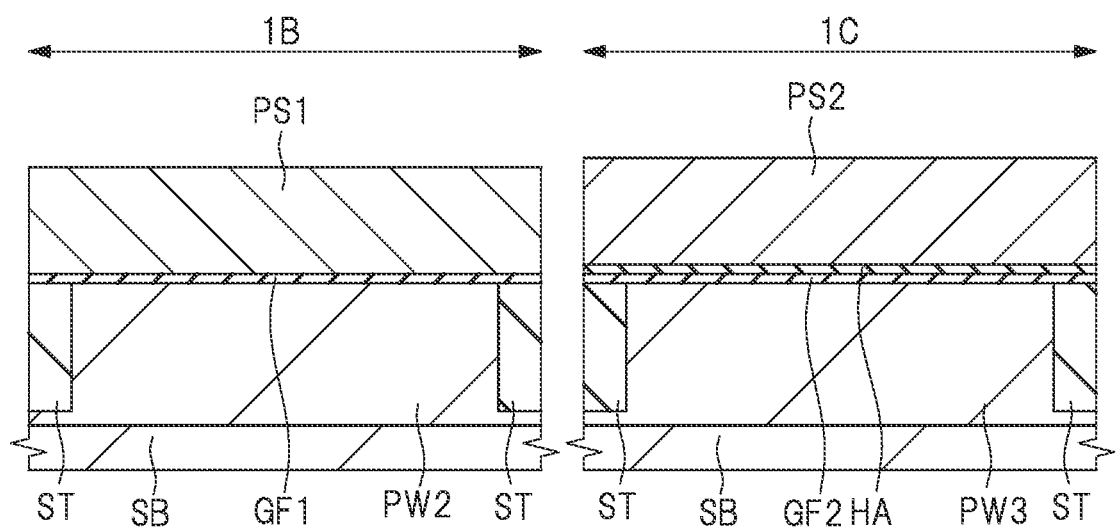
FIG. 34 is a cross-sectional view of a main part of the same semiconductor device as that in FIG. 33 during the manufacturing process.

Next, as shown in FIGS. 31 and 32, an insulating film IL1 as an interlayer insulating film is formed over the entire main surface of the semiconductor substrate SB so as to cover the control gate electrode CG, the memory gate electrode MG, the gate electrodes GE1 and GE2, and the sidewall spacers SW. After forming the insulating film IL1, an upper surface of the insulating film IL1 is flattened by using a CMP (Chemical Mechanical Polishing) method or the like if necessary. Then, after forming contact holes in the insulating film IL1, a conductive plug PG is formed in each contact hole. Thereafter, after forming an insulating film IL2 on the insulating film IL1 in which the plugs PG are embedded, wiring trenches are formed in the insulating film IL2 and then a wiring M1 is formed in each wiring trench by using a single damascene technique. After that, wirings for a second and subsequent layers are formed by a dual damascene method or the like, but its illustration and description are omitted herein.

As described above, the semiconductor device according to the present embodiment is manufactured.

Incidentally, the gate insulating film CF of the control transistor 2 is formed of the insulating film GF2 and the Hf-containing film HA formed on the insulating film GF2 and, in FIGS. 19 to 32, the gate insulating film CF is shown as a laminated film of the insulating film GF2 and the Hf-containing film HA formed on the insulating film GF2. However, the gate insulating film CF may be not only a case where it is composed of a laminated film of the insulating film GF2 and the Hf-containing film HA but also a case where it is composed of a mixed layer (mixing layer) of the insulating film GF2 and the Hf-containing film HA. For example, in various heating steps after forming the Hf-containing film HA, the insulating film GF2 and the Hf-containing film HA on the insulating film GF2 may be mixed to form a mixed layer, and the Hf-containing film HA on the insulating film GF2 may diffuse into the insulating film GF2.

Similarly, the gate insulating film MF of the memory transistor 3 may be not only a case where it is composed of a laminated film of the insulating film MZ and the Hf-containing film HA but also a case where it is composed of a mixed layer (mixing layer) of the insulating film MZ and the Hf-containing film HA. Similarly, the gate insulating film TF2 of the MISFET 5 may be not only a case where it is composed of a laminated film of the insulating film GF2 and the Hf-containing film HA but also a case where it is composed of a mixed layer (mixing) of the insulating film GF2 and the Hf-containing film HA.

Next, background of examinations by the present inventors will be described.

Various circuits are formed in the semiconductor device, and transistors having characteristics as required are used. For example, a transistor with a low leakage current at a time of being turned off may be required. The transistor having a low leakage current at the time of being turned off is used in, for example, a circuit that operates even during standby or sleep (a power supply circuit etc. during standby). In addition, a transistor with a large on-current may be required. The transistor having a large on-current is used in, for example, a circuit (an arithmetic circuit etc. of CPU) utilized at a time of operating a device.

The transistor with a low leakage current at the time of being turned off can be realized by increasing (an absolute value of) a threshold voltage of the transistor. As a method of increasing the threshold voltage, there is a method of increasing impurity concentration in a channel forming region of the transistor. When the impurity concentration in the channel forming region is increased, the threshold voltage can be increased. However, problems may arise about an increase in junction leakage currents and an increase in random variations in characteristics. Therefore, the present inventors have considered increasing the threshold voltage of the transistor by introducing Hf (hafnium), which is a high-k material, into the gate insulating film. By introducing Hf (hafnium) into the gate insulating film, the threshold voltage of the transistor can be increased, and the problems about the increase in leakage currents and the increase in random variations in characteristics can be suppressed or prevented from arising.

Incidentally, described has been a case where Hf (hafnium) is introduced into the gate insulating film as a typical example of the High-k material in order to increase the threshold voltage of the transistor. However, as an element to be introduced into the gate insulating film in order to increase the threshold voltage of the transistor, Al (aluminum) or Zr (zirconium) can also be used besides Hf (hafnium).

However, when Hf (hafnium) is introduced into the gate insulating film, the threshold voltage of the transistor can be increased, while an on-current (current flowing through the transistor when the transistor is turned on) becomes small due to the increase in threshold voltage. Therefore, in order to reduce a leakage current at the time of being tuned off, it is suitable to introduce Hf (hafnium) in the gate insulating film, while in order to increase the on-current, it is suitable to introduce no Hf (hafnium) in the gate insulating film. This applies also to a case of using Al (aluminum) or Zr (zirconium) instead of Hf (hafnium).

Therefore, the transistor in which Hf (hafnium) is introduced into the gate insulating film is applied to a transistor that requires a low leakage current at the time of being turned off, and the transistor in which no Hf (hafnium) is introduced into the gate insulating film is applied to a transistor that requires a large on-current. Consequently, a transistor having characteristics required according to a circuit used can be formed in the semiconductor device, so that performance of the semiconductor device can be improved.

For this reason, the inventors have considered a manufacturing process capable of forming, on or over a common semiconductor substrate SB, both a transistor having a gate insulating film in which Hf (hafnium) is introduced and a transistor having a gate insulating film in which no Hf (hafnium) is introduced. As a result, according to the manufacturing process described with reference to FIGS. 1 to 32 as mentioned above, a transistor having the gate insulating film in which Hf (hafnium) is introduced and a transistor having the gate insulating film in which no Hf (hafnium) is introduced can easily and accurately be formed on or over the common semiconductor substrate SB.

Here, the following method can be considered as a method of forming, on or over the common semiconductor substrate, both the gate insulating film in which Hf (hafnium) is introduced and the gate insulating film in which no Hf (hafnium) is introduced. That is, after forming a silicon oxide film for gate insulating film on or over the main surface of the semiconductor substrate and further forming a Hf-containing film (corresponding to the above-mentioned Hf-containing film HA) on or over the entire main surface of the semiconductor substrate, the Hf-containing film is removed in a region where the gate insulating film to be not introduced is to be formed (corresponding to the above-mentioned transistor forming region 1B). Thereafter, a silicon oxide film for gate insulating film is formed again in a region (corresponding to the transistor forming region 1B)

where the gate insulating film introducing no Hf is to be formed. Consequently, the gate insulating film introducing Hf and the gate insulating film introducing no Hf can be formed on or over the main surface of the semiconductor substrate.

However, in a case of this method, when the silicon oxide film for gate insulating film is formed again in the region (corresponding to the transistor forming region 1B) where the gate insulating film introducing no Hf is to be formed, the Hf-containing film that has already been formed may be contaminated or change in quality and characteristics of the transistor (corresponding to the above-mentioned MISFET 5) having the gate insulating film introducing Hf may deteriorate or fluctuate. Further, when the silicon oxide film for gate insulating film is formed again in the region (corresponding to the transistor forming region 1B) where the gate insulating film introducing no Hf is to be formed, a thickness of the gate insulating film in another region may be increase and the characteristics of the transistor having the gate insulating film introducing Hf may deviate from a design value.

In the manufacturing process of the present embodiment described with reference to FIGS. 1 to 32 as mentioned above, the gate insulating film CF of the control transistor 2, the gate insulating film MF of the memory transistor 3, and the gate insulating film TF2 of the MISFET 5 contain Hf (hafnium), that is, Hf (hafnium) is introduced thereinto. Therefore, as compared with a case where no Hf (hafnium) is introduced in the gate insulating films CF, MF, TF2, a case where Hf (hafnium) is introduced in the gate insulating films CF, MF, TF2 can increase each threshold voltage of the control transistor 2, the memory transistor 3, and the MISFET 5, thereby reducing (decreasing) a leakage current at a time of being turned off. Further, in the manufacturing process of the present embodiment described with reference to FIGS. 1 to 32 as mentioned above, the gate insulating film TF1 of the MISFET 4 contains no Hf (hafnium), that is, Hf (hafnium) is introduced thereinto.

Therefore, as compared with the case where Hf (hafnium) is introduced in the gate insulating film TF1, the case where no Hf (hafnium) is introduced in the gate insulating film TF1 can reduce the threshold voltage of the MISFET 4, thereby increasing the on-current of the MISFET 4. Accordingly, the performance of the semiconductor device can be improved.

The Hf-containing film HA is required for the gate insulating films CF and MF of the control transistor 2 and the memory transistor 3 formed in the memory cell region 1A, and the gate insulating film TF2 of the MISFET 5 formed in the transistor forming region 1C, and is not required for the gate insulating film TF1 of the MISFET 4 formed in the transistor forming region 1B. However, in a film forming process of the Hf-containing film HA, it is difficult to form the Hf-containing film HA only in the memory cell region 1A and the transistor forming region 1C and not to form the Hf-containing film HA in the transistor forming region 1B. In contrast, in the present embodiment, as shown in FIGS. 13 and 14, in the transistor forming region 1B, the insulating film GF1 for gate insulating film and a conductive film for gate electrode (here, silicon film PS1) are formed over the semiconductor substrate SB (on and over the p-type well PW2); and in the memory cell region 1A and the transistor forming region 1C, the Hf-containing film HA is formed in a state where an insulating film for gate insulating film (here, insulating films GF2 and MZ) is formed over the semiconductor substrate SB (on the p-type wells PW1, PW3) but a conductive film for gate electrode (silicon films PS1 and PS2) is not formed. Consequently, in the memory cell region 1A and the transistor forming region 1C, the Hf-containing film HA leads to being formed on the insulating film for gate insulating film (here, insulating films GF2 and MZ), so that the gate insulating films CF, MF, and TF2 containing Hf (hafnium) can be formed. In addition, in the transistor forming region 1B, the Hf-containing film HA is formed not on the insulating film GF1 for gate insulating film but on the silicon film PS1, so that the gate insulating film TF1 containing no Hf (hafnium) can be formed.

Further, in the present embodiment, the insulating films GF1, GF2, and MZ are formed before the Hf-containing film HA is formed. Consequently, each step of forming the insulating films GF1, GF2, and MZ does not adversely affect the Hf-containing film HA. This makes it possible to prevent deterioration and fluctuation of the characteristics of the transistor having the gate insulating film introducing Hf and to form a transistor having desired characteristics. Therefore, the performance of the semiconductor device can be improved.

In the manufacturing process of the present embodiment described with reference to FIGS. 1 to 32 as mentioned above, explained has been the case where Hf (hafnium) is introduced into the gate insulating films CF, MF, and TF2 of the control transistor 2, the memory transistor 3, and the MISFET 5 and where no Hf (hafnium) is introduced into the gate insulating film TF1 of the MISFET 4. As a modification example, Hf (hafnium) may be introduced into the gate insulating film in any one or more of the control transistor 2, the memory transistor 3, the MISFET 4, and the MISFET 5, and no Hf (hafnium) may be introduced into the gate insulating film in any one or more of the control transistor 2, the memory transistor 3, the MISFET 4, and the MISFET 5. This applies not only to the present embodiment but also to the following second and third embodiments.

For example, there may be a case where: Hf (hafnium) is introduced into the gate insulating film of the MISFET 4; Hf (hafnium) is introduced into the gate insulating film of one of the control transistor 2 and the memory transistor 3; and no Hf (hafnium) is introduced into the gate insulating film in the other of the control transistor 2 and the memory transistor 3. Further, there may be a case where: no Hf (hafnium) is introduced in the gate insulating film of the MISFET 4; Hf (hafnium) is introduced in the gate insulating film of one of the control transistor 2 and the memory transistor 3; and no Hf (hafnium) is introduced into the gate insulating film of the other of the control transistor 2 and the memory transistor 3. Furthermore, there may be a case where: Hf (hafnium) is introduced into the gate insulating film of the MISFET 4; and no Hf (hafnium) is introduced into the gate insulating films of both the control transistor 2 and the memory transistor 3. Moreover, there may be a case where: no Hf (hafnium) is introduced into the gate insulating film of the MISFET 4; and Hf (hafnium) is introduced into the gate insulating films in both the control transistor 2 and the memory transistor 3. In addition, there may be a case where: Hf (hafnium) is introduced into the gate insulating film of the MISFET 4; no Hf (hafnium) is introduced in the gate insulating film of the MISFET 5; and a memory cell (control transistor 2 and memory transistor 3) itself is not provided. In any case, the gate electrode of the transistor in which Hf (hafnium) is introduced into the gate insulating film is formed by the patterned silicon film PS2, and the gate electrode of the transistor introducing no Hf (hafnium) into the gate insulating film is formed by the patterned silicon film PS1.

Second Embodiment

Each of FIGS. 33 to 36 is a cross-sectional view of a main part of a semiconductor device according to a second embodiment during a manufacturing process thereof.

Since a manufacturing process of a semiconductor device according to a second embodiment is the same as that of the first embodiment until a structure of FIGS. 17 and 18 is obtained, a repetitive description thereof is omitted here and a process after obtaining the structure of FIGS. 17 and 18 will be described.

In the present second embodiment, after obtaining the structure of FIGS. 17 and 18 by performing the forming step of the silicon film PS2 similarly to the first embodiment, the silicon film PS2 and the Hf-containing film HA in the transistor forming region 1B are removed by using a photolithography technique and an etching technique. At this time, since the memory cell region 1A and the transistor forming region 1C are covered with a photoresist film (not shown), the silicon film PS2 and Hf-containing film HA in the memory cell region 1A and the silicon film PS2 and Hf-containing film HA in the transistor forming region 1C remain (are left) without being etched. Consequently, the memory cell region 1A and the transistor forming region 1C each become a state where the silicon film PS2 is formed and the silicon film PS1 is not formed, and the transistor forming region 1B becomes a state where the silicon film PS1 is formed and the silicon film PS2 is not formed.

Figure 35:
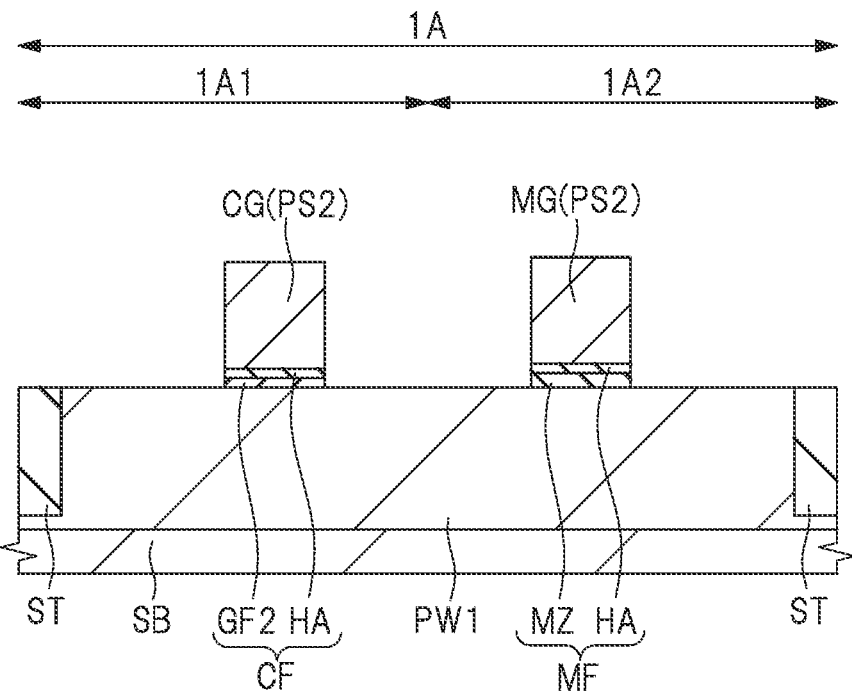
FIG. 35 is a cross-sectional view of a main part of a semiconductor device during a manufacturing process following FIG. 33.
Figure 36:
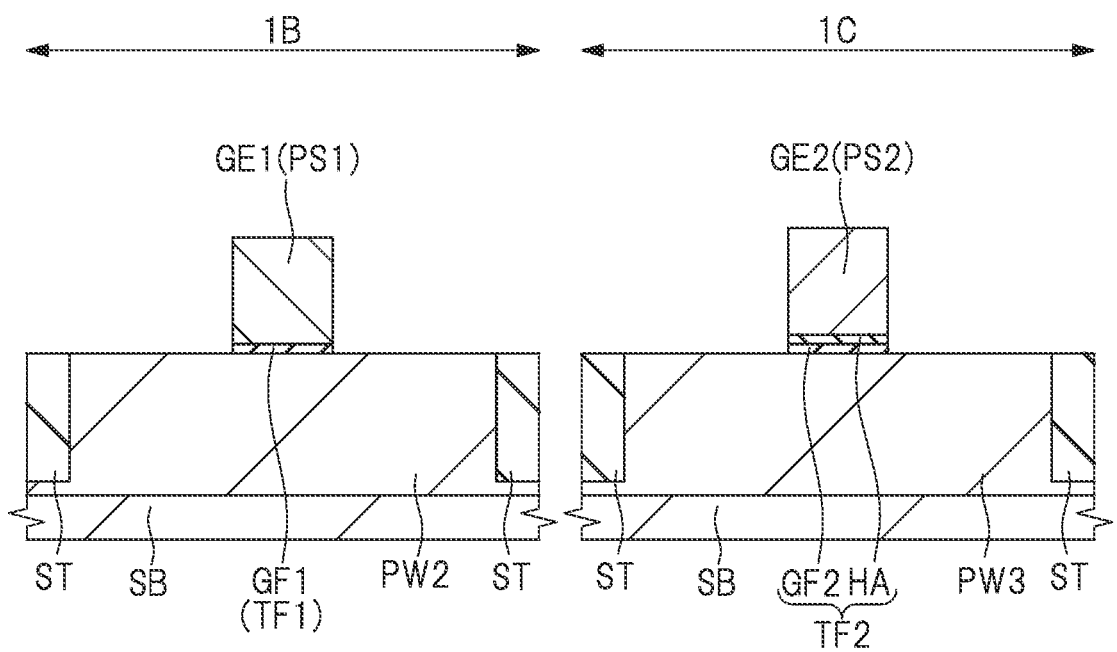
FIG. 36 is a cross-sectional view of a main part of the same semiconductor device as that in FIG. 35 during the manufacturing process.

Next, as shown in FIGS. 35 and 36, by using the photolithography technique and the etching technique to pattern the silicon films PS2 in the memory cell region 1A and the transistor forming region 1C and the silicon film PS1 in the transistor forming region 1B, the control gate electrode CG, memory gate electrode MG, gate electrode GE2, and gate electrode GE1 are formed. The control gate electrode CG is composed of the patterned silicon film PS2 and is formed in the control transistor forming region 1A1 of the memory cell region 1A. Further, the memory gate electrode MG is composed of the patterned silicon film PS2 and is formed in the memory transistor forming region 1A2 of the memory cell region 1A. Furthermore, the gate electrode GE1 is composed of the patterned silicon film PS1 and is formed in the transistor forming region 1B. Moreover, the gate electrode GE2 is composed of the patterned silicon film PS2 and is formed in the transistor forming region 1C.

In the control transistor forming region 1A1 of the memory cell region 1A, the Hf-containing film HA and the insulating film GF2 other than a portion covered with the control gate electrode CG can be removed by dry etching performed in a patterning step of the silicon films PS1 and PS2 or wet etching performed after the dry etching. Further, in the memory transistor forming region 1A2 of the memory cell region 1A, the Hf-containing film HA and the insulating film MZ other than a portion covered with the memory gate electrode MG can be removed by dry etching performed in the patterning step of the silicon films PS1 and PS2 or wet etching performed after the dry etching. Furthermore, in the transistor forming region 1B, the insulating film GF1 other than a portion covered with the gate electrode GE1 can be removed by dry etching performed in the patterning step of the silicon films PS1 and PS2 or wet etching performed after the dry etching. Moreover, in the transistor forming region 1C, the Hf-containing film HA and the insulating film GF2 other than a portion covered with the gate electrode GE2 can be removed by dry etching in the patterning step of the silicon films PS1 and PS2 or wet etching performed after the dry etching.

In the control transistor forming region 1A1 of the memory cell region 1A, the insulating film GF2 and the Hf-containing film HA remaining under the control gate electrode CG serve as the gate insulating film CF of the control transistor 2. Further, in the memory transistor forming region 1A2 of the memory cell region 1A, the insulating film MZ and the Hf-containing film HA remaining under the memory gate electrode MG serve as the gate insulating film MF of the memory transistor 3. Furthermore, in the transistor forming region 1B, the insulating film GF1 remaining under the gate electrode GE1 serves as the gate insulating film TF1 of the MISFET 4. Moreover, in the transistor forming region 1C, the insulating film GF2 and the Hf-containing film HA remaining under the gate electrode GE2 serve as the gate insulating film TF2 of the MISFET 5.

In this way, the structure of FIGS. 35 and 36 is obtained, but the structure of FIGS. 35 and 36 is the same as the structure of FIGS. 21 and 22 as described above. That is, in FIG. 35, in the memory transistor forming region 1A2 of the memory cell region 1A, the memory gate electrode MG is formed over the semiconductor substrate SB (on the p-type well PW1) via the gate insulating film MF; and in the control transistor forming region 1A1 of the memory cell region 1A, the control gate electrode CG is formed over the semiconductor substrate SUB (on the P-type well PW1) via the gate insulating film CF. In addition, in FIG. 36, in the transistor forming region 1B, the gate electrode GE1 is formed over the semiconductor substrate SB (on the p-type well PW2) via the gate insulating film TF1; and in the transistor forming region 1C, the gate electrode GE2 is formed over the semiconductor substrate SB (on the p-type well PW3) via the gate insulating film TF2.

Regarding subsequent steps, the present second embodiment is the same as the first embodiment, and the steps described with reference to FIGS. 23 to 32 are performed, but a repetitive description thereof is omitted here.

In the first embodiment, the step of forming the control gate electrode CG, the memory gate electrode MG, and the gate electrode GE2 by using the photolithography technique and the etching technique to pattern the silicon film PS2 has been a step different from the step of forming the gate electrode GE1 by using the photolithography technique and the etching technique to pattern the silicon film PS1.

In contrast, in the present second embodiment, the step of forming the control gate electrode CG, the memory gate electrode MG, and the gate electrode GE2 by using the photolithography technique and the etching technique to pattern the silicon film PS2 is the same step as the step of forming the gate electrode GE1 by using the photolithography technique and the etching technique to pattern the silicon film PS1. That is, in the present embodiment, in the same step, the silicon film PS1 and the silicon film PS2 are patterned to form the control gate electrode CG, the memory gate electrode MG, and the gate electrodes GE1 and GE2 together.

A photomask (photomask used to expose a photoresist film) used in forming the gate electrode by patterning a conductive film for forming the gate electrode needs to be manufactured with high accuracy, and so is expensive. For this reason, in the present second embodiment, the silicon films PS1 and PS2 are patterned in the same step to form the control gate electrode CG, the memory gate electrode MG, and the gate electrodes GE1 and GE2 together, so that the required number of high-accuracy photomasks for processing a gate needs fewer than that of the first embodiment.

Therefore, in the present second embodiment, the manufacturing cost of the semiconductor device can be further suppressed.

Third Embodiment

Each of FIGS. 37 to 58 is a cross-sectional view of a main part of a semiconductor device according to a third embodiment during a manufacturing process thereof.

A manufacturing process of a semiconductor device according to a third embodiment is the same as that of the first embodiment until the structure of FIGS. 1 and 2 is obtained, so that a repetitive description thereof is omitted here and a process after obtaining the structure of FIGS. 1 and 2 will be described.

Figure 37:
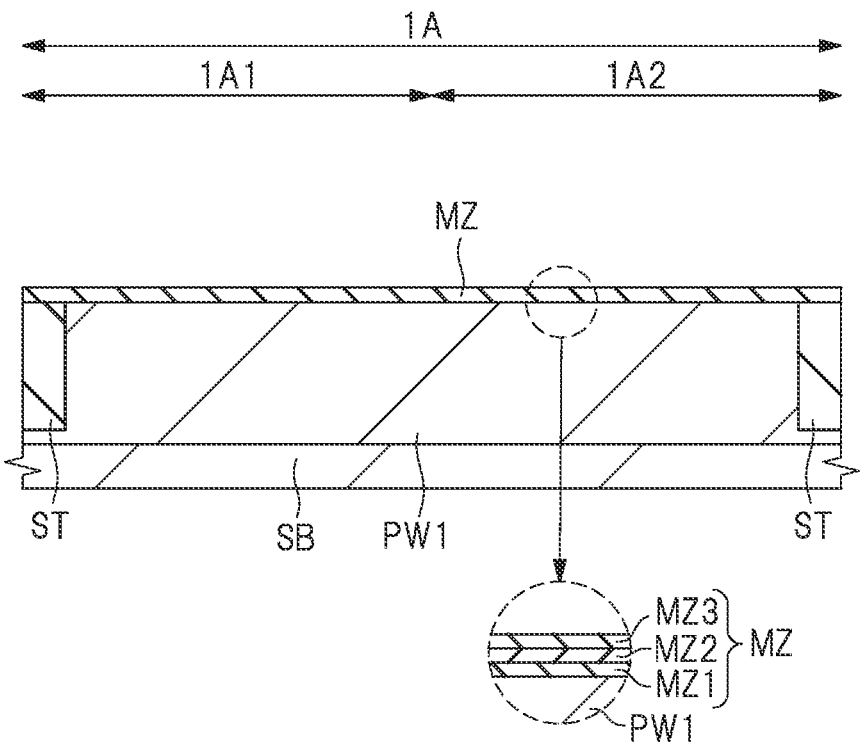
FIG. 37 is a cross-sectional view of a main part of a semiconductor device according to yet another embodiment during a manufacturing process.
Figure 38:
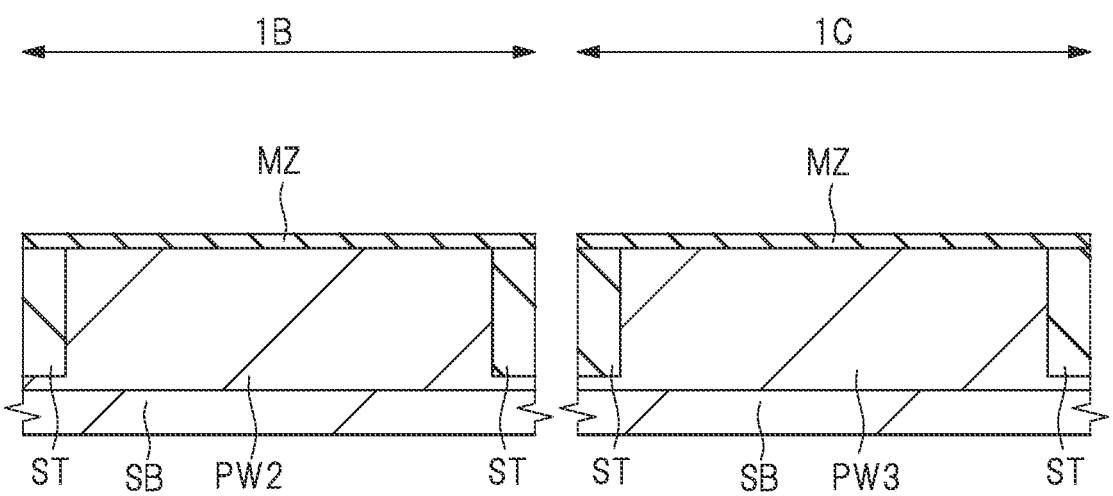
FIG. 38 is a cross-sectional view of a main part of the same semiconductor device as that in FIG. 37 during the manufacturing process.

In the present third embodiment, after obtaining the structure of FIGS. 1 and 2 by performing the steps of forming the p-type wells PW1, PW2, and PW3 in the same manner as in the first embodiment, as shown in FIGS. 37 and 38, an insulating film MZ is formed over the main surface (a surface) of the semiconductor substrate SB. The insulating film MZ is formed over a surface of the semiconductor substrate SB in the memory cell region 1A (that is, on an upper surface of the p-type well PW1), a surface of the semiconductor substrate SB in the transistor forming region 1B (that is, on an upper surface of the p-type well PW2), and a surface of the semiconductor substrate SB in the transistor forming region 1C (that is, on an upper surface of the p-type well PW3). The insulating film MZ is an insulating film for gate insulating film of the memory transistor 3 formed in the memory cell region 1A (memory transistor forming region 1A2), and is an insulating film having a charge storage portion (charge storage layer) therein. Regarding a configuration of the insulating film MZ, the present third embodiment is also the same as the first embodiment.

Incidentally, in order to make the drawings easier to see, in FIGS. 37 and 38, the insulating film MZ composed of an insulating film MZ1, an insulating film MZ2, and an insulating film MZ3 is simply illustrated as the insulating film MZ. However, in reality, as shown by an enlarged view of a region surrounded by a dotted circle in FIG. 37, the insulating film MZ is composed of a laminated film (laminated insulating film) of the insulating film MZ1, the insulating film MZ2 on the insulating film MZ1, and the insulating film MZ3 on the insulating film MZ2. Regarding materials and forming methods of the insulating films MZ1, MZ2, and MX3, the present third embodiment is also the same as the first embodiment.

Figure 39:
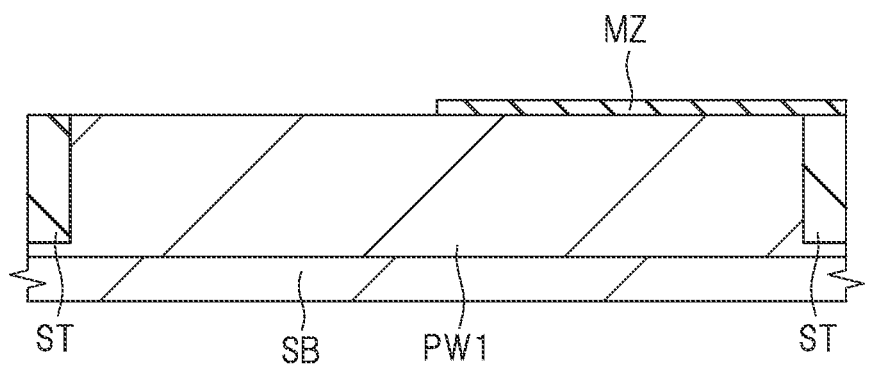
FIG. 39 is a cross-sectional view of a main part of a semiconductor device during a manufacturing process following FIG. 37.
Figure 40:
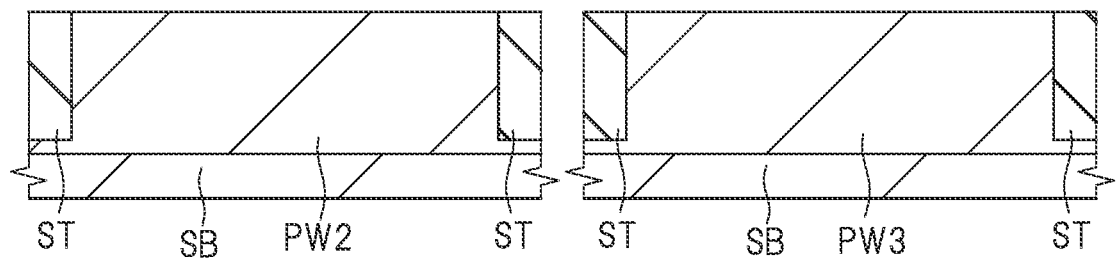
FIG. 40 is a cross-sectional view of a main part of the same semiconductor device as that in FIG. 39 during the manufacturing process.

Next, as shown in FIGS. 39 and 40, by using the photolithography technique and the etching technique, the insulating films MZ in the transistor forming regions 1B and 1C and the insulating film MZ in the control transistor forming region 1A1 of the memory cell region 1A are removed, and the insulating film MZ in the memory transistor forming region 1A2 of the memory cell region 1A remains without being removed. This step can be performed by the same method as that of the step of FIGS. 9 and 10 as described above.

Figure 41:
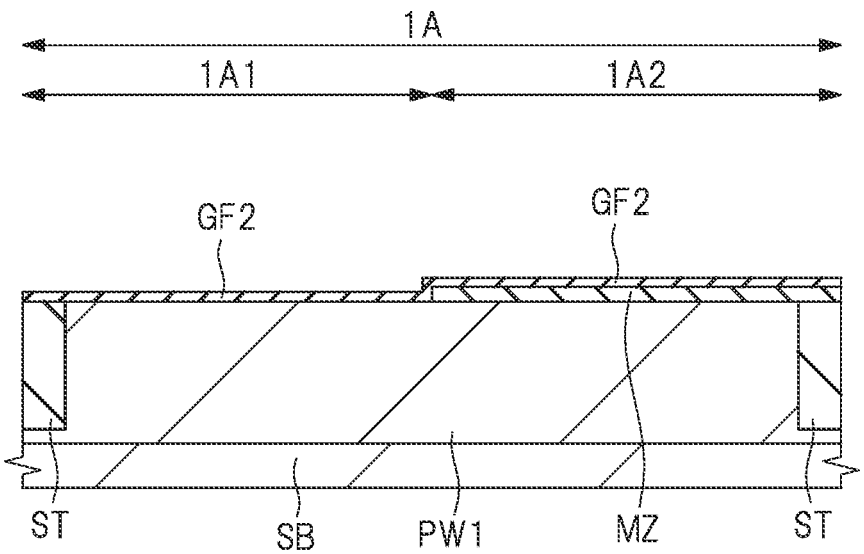
FIG. 41 is a cross-sectional view of a main part of a semiconductor device during a manufacturing process following FIG. 39.
Figure 42:
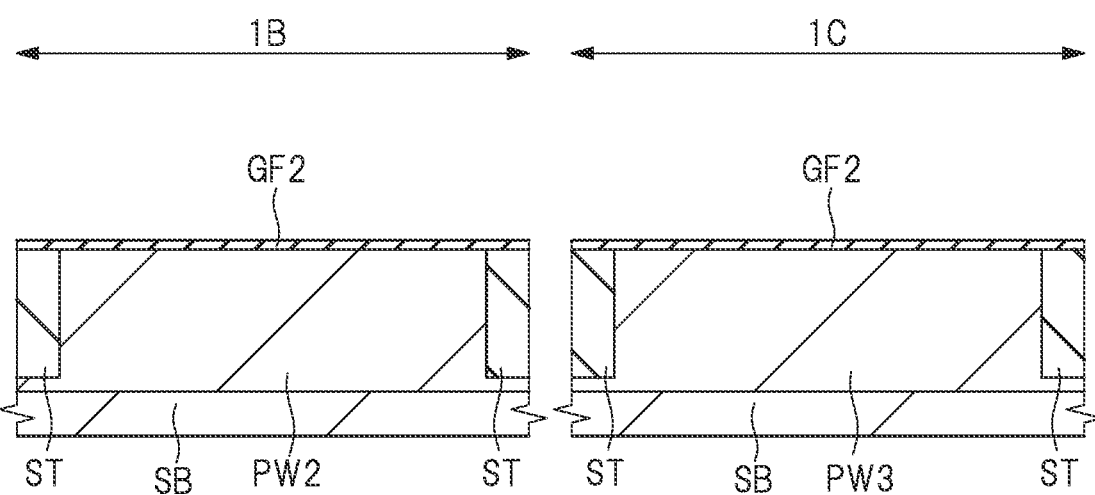
FIG. 42 is a cross-sectional view of a main part of the same semiconductor device as that in FIG. 41 during the manufacturing process.

Next, as shown in FIGS. 41 and 42, an insulating film GF2 is formed over the main surface (a surface) of the semiconductor substrate SB. In the transistor forming region 1B, the insulating film GF2 is formed over the surface of the semiconductor substrate SB (that is, on the upper surface of the p-type well PW2); and in the transistor forming region 1C, the insulating film GF2 is formed over the surface of the semiconductor substrate SB (that is, on the upper surface of the p-type well PW3). In the control transistor forming region 1A1 (thus, in a region where the insulating film MZ is not formed) of the memory cell region 1A, the insulating film GF2 is formed over the surface of the semiconductor substrate SB (that is, on the upper surface of the p-type well PW1). In the memory transistor forming region 1A2 (thus, in a region where the insulating film MZ is formed) of the memory cell region 1A, the insulating film GF2 is formed on the insulating film MZ. The insulating film GF2 also serves as both of an insulating film for gate insulating film of the control transistor 2 formed in the memory cell region 1A and an insulating film for gate insulating film of the MISFET 5 formed in the transistor forming region 1C. Regarding a material and a forming method of the insulating film GF2, the present third embodiment is also the same as the first embodiment.

Figure 43:
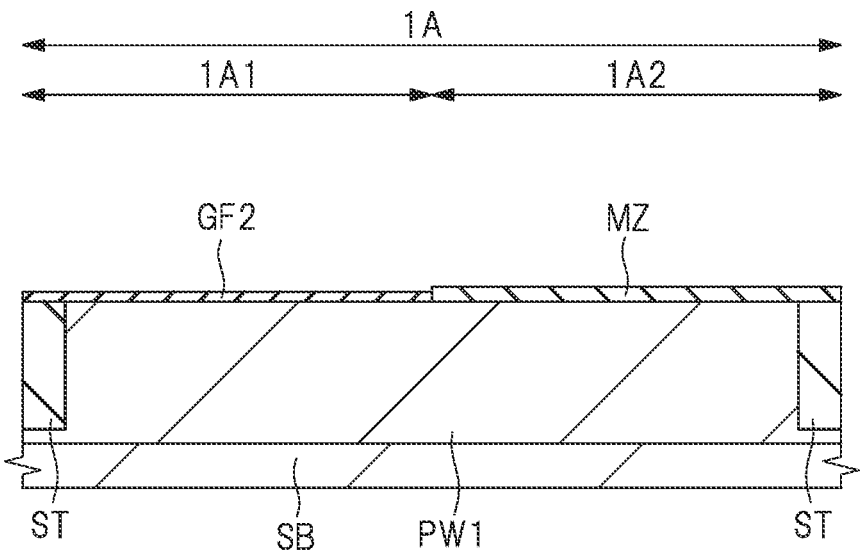
FIG. 43 is a cross-sectional view of a main part of a semiconductor device during a manufacturing process following FIG. 41.
Figure 44:
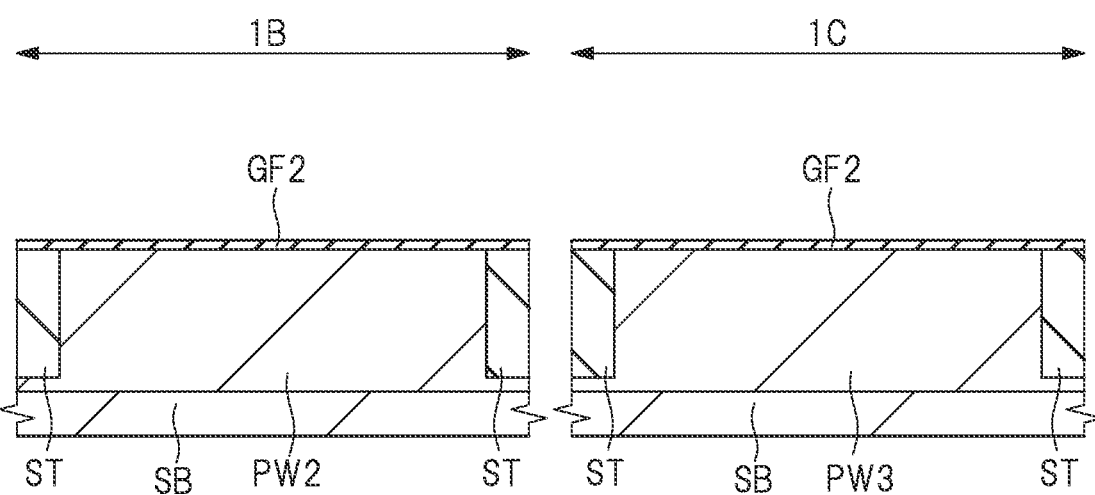
FIG. 44 is a cross-sectional view of a main part of the same semiconductor device as that in FIG. 43 during the manufacturing process.

Next, as shown in FIGS. 43 and 44, the insulating film GF2 formed on the insulating film MZ in the memory transistor forming region 1A2 of the memory cell region 1A is removed by using the photolithography technique and the etching technique. At this time, the insulating film GF2 formed over the semiconductor substrate SB (on the p-type well PW1) in the control transistor forming region 1A1 of the memory cell region 1A remains without being removed, and the insulating films GF2 in the transistor forming regions 1B and 1C also remain without being removed.

This stage (stage of FIGS. 43 and 44) becomes a state where: in the control transistor forming region 1A1 of the memory cell region 1A, the insulating film GF2 is formed over the semiconductor substrate SB (on the p-type well PW1); and in the transistor forming region 1A2 of the memory cell region 1A, the insulating film MZ is formed over the semiconductor substrate SB (on the p-type well PW1). Further, this stage (stage of FIGS. 43 and 44) becomes a state where: in the transistor forming region 1B, the insulating film GF2 is formed over the semiconductor substrate SB (on the p-type well PW2); and in the transistor forming region 1C, the insulating film GF2 is formed over the semiconductor substrate SB (on the p-type well PW3).

Figure 45:
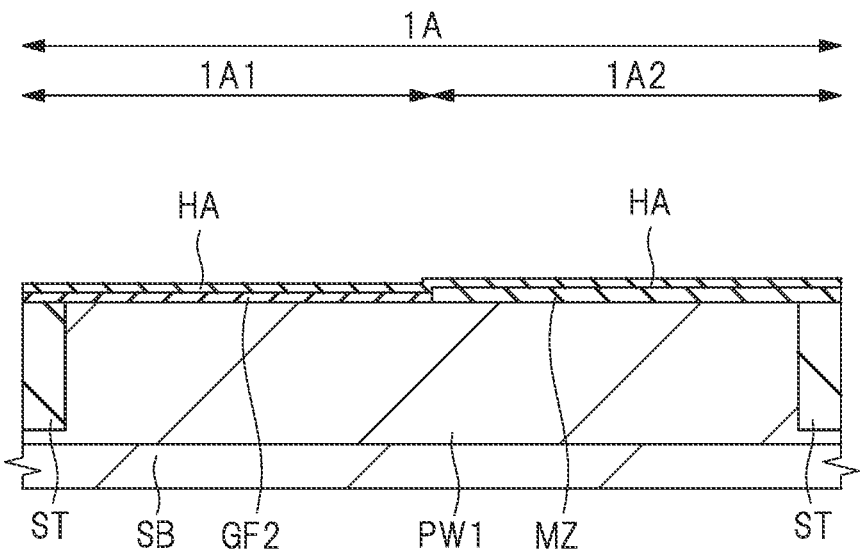
FIG. 45 is a cross-sectional view of a main part of a semiconductor device during a manufacturing process following FIG. 43.
Figure 46:
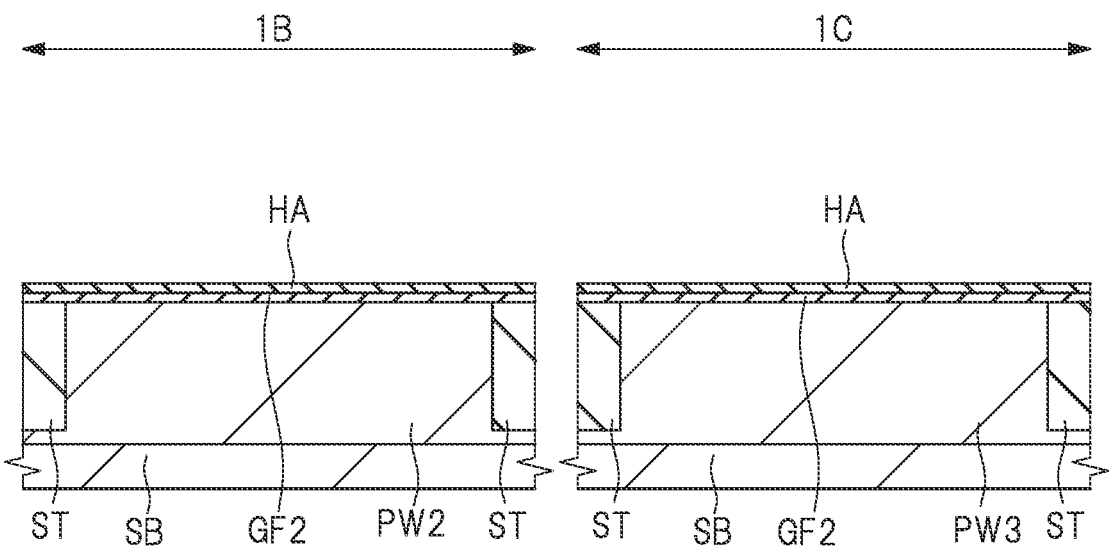
FIG. 46 is a cross-sectional view of a main part of the same semiconductor device as that in FIG. 45 during the manufacturing process.

Next, as shown in FIGS. 45 and 46, an Hf-containing film HA is formed over the entire main surface of the semiconductor substrate SB. Regarding a material and a forming method of the Hf-containing film HA, the present third embodiment is also the same as the first embodiment. In the control transistor forming region 1A1 of the memory cell region 1A, the Hf-containing film HA is formed on the insulating film GF2. In the memory transistor forming region 1A2 of the memory cell region 1A, the Hf-containing film HA is formed on the insulating film MZ. In the transistor forming regions 1B and 1C, the Hf-containing film HA is formed on the insulating film GF2.

Figure 47:
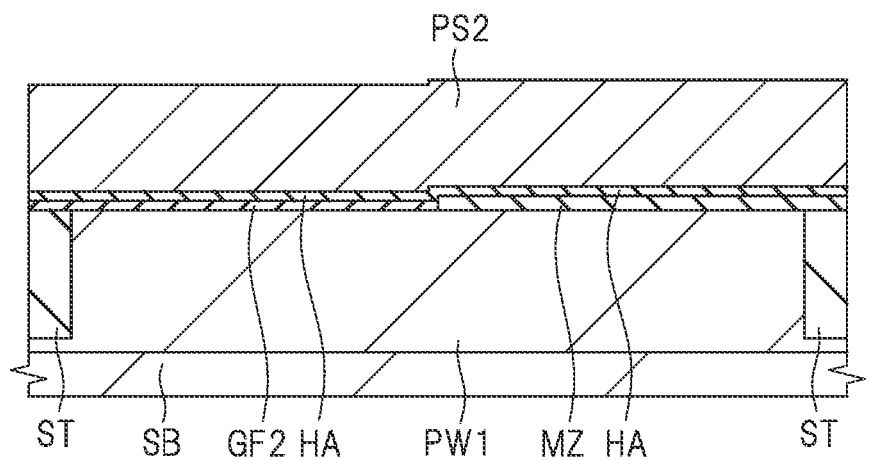
FIG. 47 is a cross-sectional view of a main part of a semiconductor device during a manufacturing process following FIG. 45.
Figure 48:
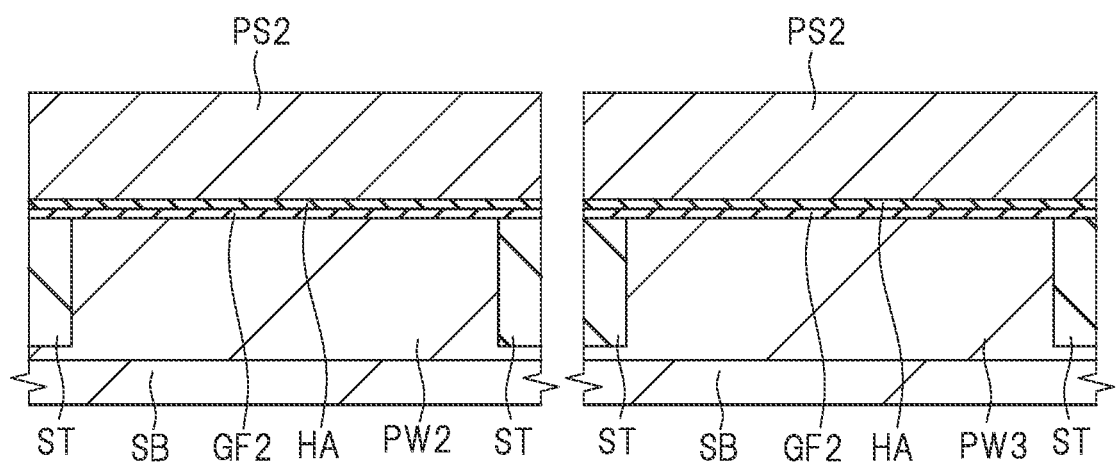
FIG. 48 is a cross-sectional view of a main part of the same semiconductor device as that in FIG. 47 during the manufacturing process.

Next, as shown in FIGS. 47 and 48, the silicon film PS2 is formed over the main surface (entire main surface) of the semiconductor substrate SB, that is, on the Hf-containing film HA. Regarding a material and a forming method of the silicon film PS2, the present third embodiment is also the same as the first embodiment. In the memory cell region 1A, the transistor forming region 1B, and the transistor forming region 1C, the silicon film PS2 is formed on the Hf-containing film HA. The silicon film PS2 serve as all of a conductive film for gate electrode of the control transistor 2 formed in the memory cell region 1A, a conductive film for gate electrode of the memory transistor 3 formed in the memory cell region 1A, and a conductive film for gate electrode of the MISFET 5 formed in the transistor forming region 1C.

Figure 49:
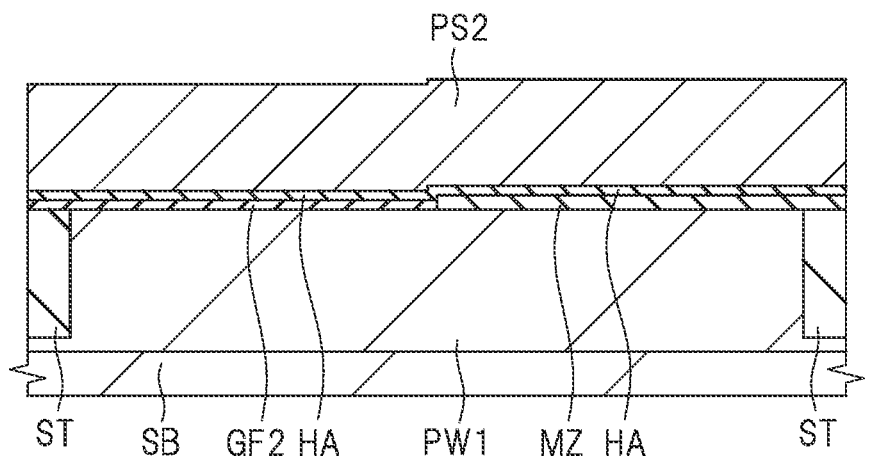
FIG. 49 is a cross-sectional view of a main part of a semiconductor device during a manufacturing process following FIG. 47.
Figure 50:
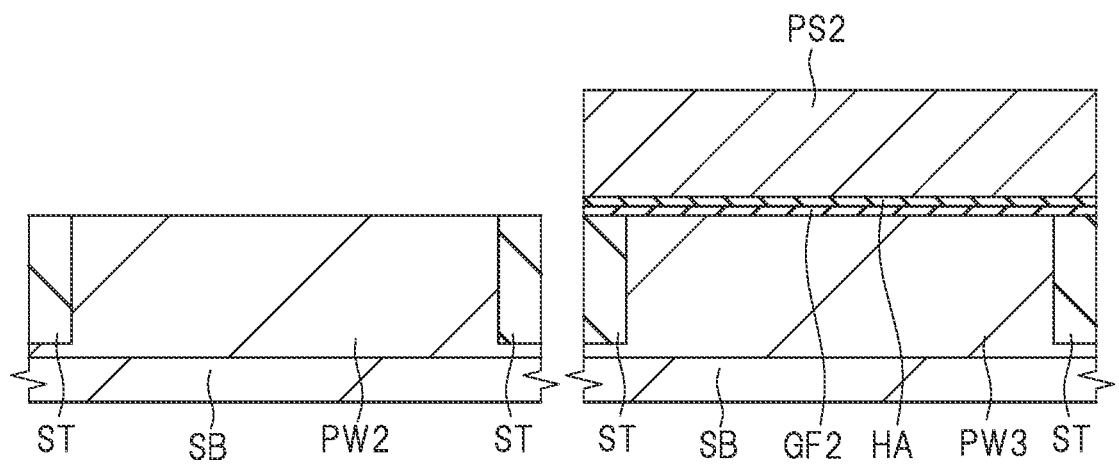
FIG. 50 is a cross-sectional view of a main part of the same semiconductor device as that in FIG. 49 during the manufacturing process.

Next, as shown in FIGS. 49 and 50, the silicon film PS2, the Hf-containing film HA, and the insulating film GF2 in the transistor forming region 1B are removed by using the photolithography technique and the etching technique. At this time, the silicon film PS2, the Hf-containing film HA, the insulating film GF2, and the insulating film MZ in the memory cell region 1A are left without being removed, and the silicon film PS2, the Hf-containing film HA, and the insulating film GF2 in the transistor forming region 1C are also left without being removed. Specifically, after forming such a photoresist film (not shown) that covers the silicon films PS2 in the memory cell region 1A and the transistor forming region 1C and exposes the silicon film PS2 in the transistor forming region 1B, this photoresist film is used as an etching mask to etch the silicon film PS2. This makes it possible to selectively remove the silicon film PS2, the Hf-containing film HA, and the insulating film GF2 in the transistor forming region 1B.

Next, as shown in FIGS. 51 and 52, the insulating film GF1 is formed over the main surface of the semiconductor substrate SB. The insulating film GF1 is an insulating film for gate insulating film of the MISFET 4 formed in the transistor forming region 1B. Regarding a material and a forming method of the insulating film GF1, the present third embodiment is also the same as the first embodiment. In the transistor forming region 1B, the insulating film GF1 is formed over the front surface of the semiconductor substrate SB (that is, on the upper surface of the p-type well PW2) and, in the memory cell region 1A and the transistor forming region 1C, the insulating film GF1 is formed on a surface of the silicon film PS2.

Figure 53:
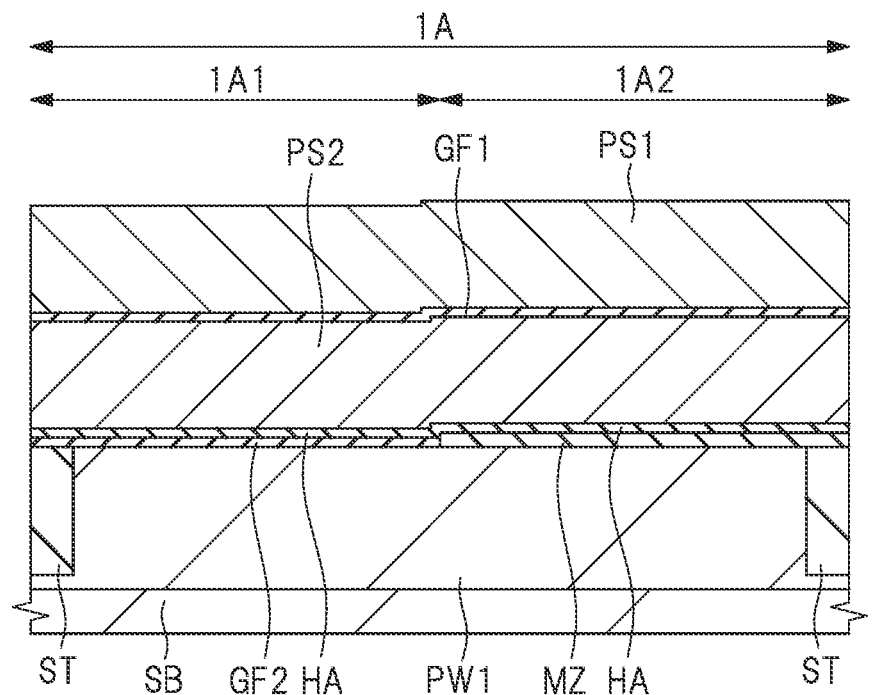
FIG. 53 is a cross-sectional view of a main part of a semiconductor device during a manufacturing process following FIG. 51.
Figure 54:
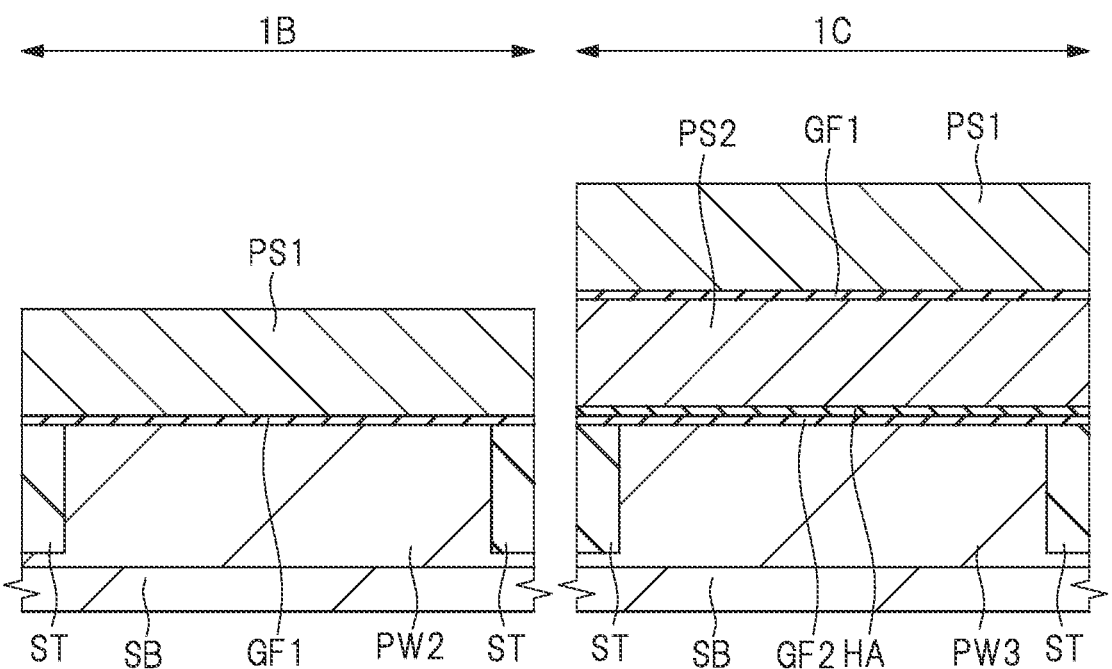
FIG. 54 is a cross-sectional view of a main part of the same semiconductor device as that in FIG. 53 during the manufacturing process.

Next, as shown in FIGS. 53 and 54, the silicon film PS1 is formed over the main surface (entire main surface) of the semiconductor substrate SB, that is, on the insulating film GF1. Regarding a material and a forming method of the silicon film PS1, the present third embodiment is also the same as the first embodiment. In the memory cell region 1A, the transistor forming region 1B, and the transistor forming region 1C, the silicon film PS1 is formed on the insulating film GF1. The silicon film PS1 is a conductive film for gate electrode of the MISFET 4 formed in the transistor forming region 1B.

Figure 55:
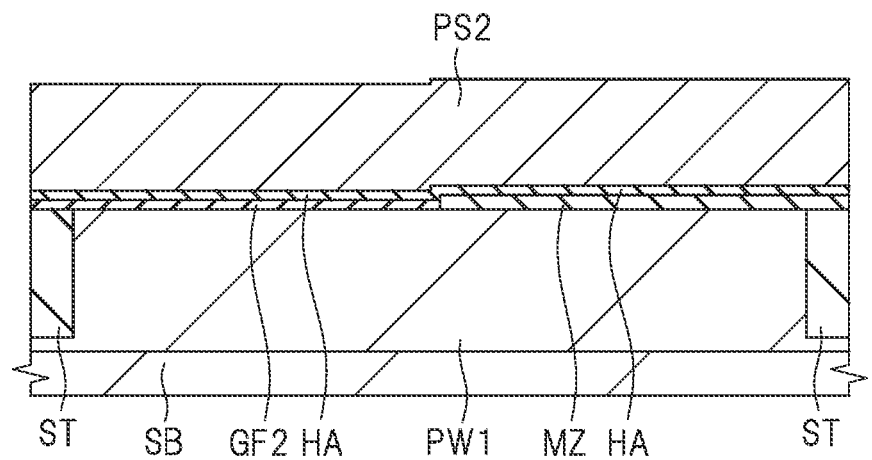
FIG. 55 is a cross-sectional view of a main part of a semiconductor device during a manufacturing process following FIG. 53.
Figure 56:
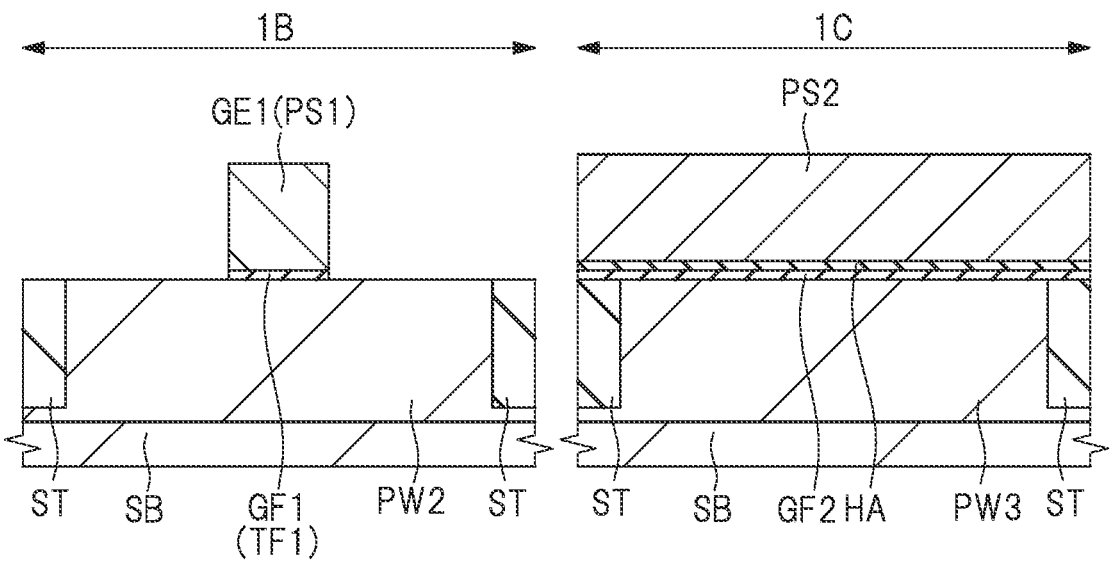
FIG. 56 is a cross-sectional view of a main part of the same semiconductor device as that in FIG. 55 during the manufacturing process.

Next, as shown in FIGS. 55 and 56, by using the photolithography technique and the etching technique to pattern the silicon film PS1, the gate electrode GE1 composed of the patterned silicon film PS1 is formed. At this time, the silicon films PS1 and the insulating films GF1 in the memory cell region 1A and the transistor forming region 1C are removed. The gate electrode GE1 is formed in the transistor forming region 1B.

In the transistor forming region 1B, the insulating film GF1 other than a portion covered with the gate electrode GE1 can be removed by dry etching performed in the patterning step of the silicon film PS1 or wet etching performed after the dry etching. In the transistor forming region 1B, the insulating film GF1 remaining under the gate electrode GE1 serves as the gate insulating film TF1 of the MISFET 4. In the transistor forming region 1B, the gate electrode GE1 is formed over the semiconductor substrate SB (on the p-type well PW2) via the gate insulating film TF1 composed of the insulating film GF1. Further, in the memory cell region 1A and the transistor forming region 1C, the silicon film PS1 is removed in the patterning step of the silicon film PS1. Furthermore, in the memory cell region 1A and the transistor forming region 1C, the insulating film GF1 can be removed by dry etching performed in the patterning step of the silicon film PS1 or wet etching performed after the dry etching.

Figure 57:
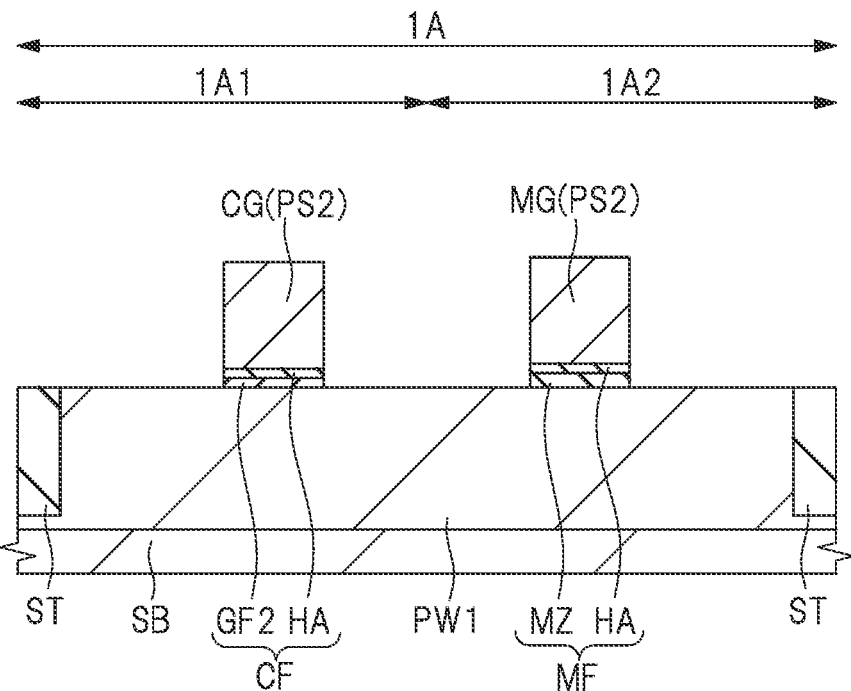
FIG. 57 is a cross-sectional view of a main part of a semiconductor device during a manufacturing process following FIG. 55.
Figure 58:
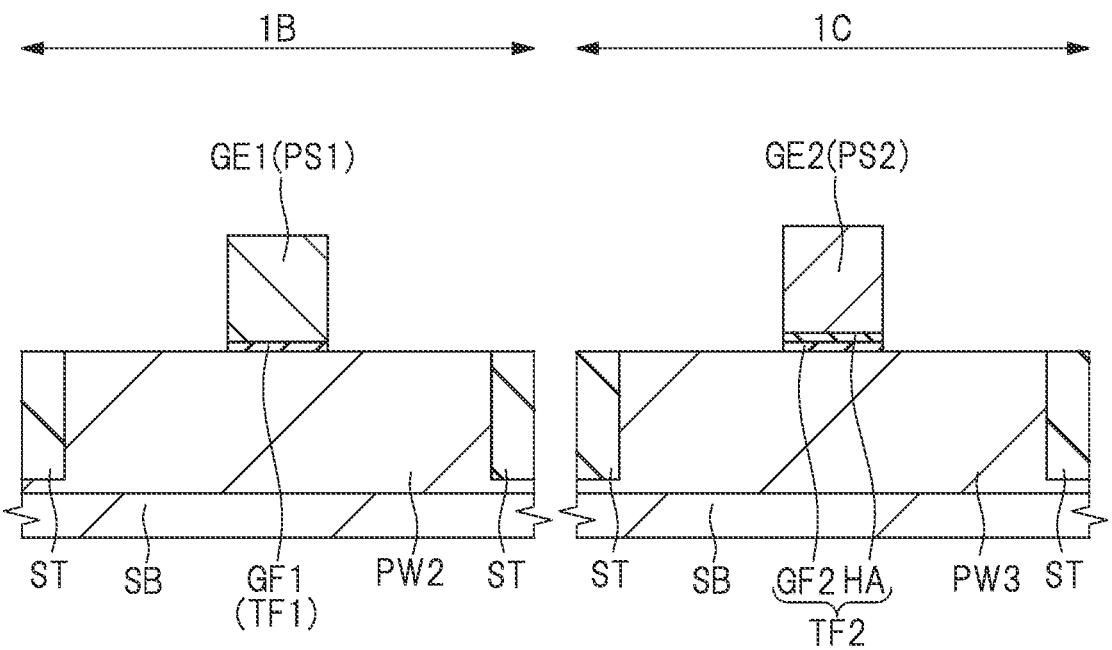
FIG. 58 is a cross-sectional view of a main part of the same semiconductor device as that in FIG. 57 during the manufacturing process.

Next, as shown in FIGS. 57 and 58, by using photolithography technique and etching technique to pattern the silicon films PS2 in the memory cell region 1A and the transistor forming region 1C, the control gate electrode CC, the memory gate electrode MG, and the gate electrode GE2 each composed of the patterned silicon film PS2 are formed. At this time, since the transistor forming region 1B is covered with a photoresist film (not shown), the semiconductor substrate SB (p-type well PW2) and the gate electrode GE1 in the transistor forming region 1B are not etched. The control gate electrode CG is formed in the control transistor forming region 1A1 of the memory cell region 1A, the memory gate electrode MG is formed in the memory transistor forming region 1A2 of the memory cell region 1A, and the gate electrode GE2 is formed in the transistor forming region 1C.

In the control transistor forming region 1A1 of the memory cell region 1A, the Hf-containing film HA and the insulating film GF2 other than a portion covered with the control gate electrode CG can be removed by dry etching performed in the patterning step of the silicon film PS2 or wet etching performed after the dry etching. Further, in the memory transistor forming region 1A2 of the memory cell region 1A, the Hf-containing film HA and the insulating film MZ other than a portion covered with the memory gate electrode MG can be removed by dry etching performed in the patterning step of the silicon film PS2 or wet etching performed after the dry etching. Furthermore, in the transistor forming region 1C, the Hf-containing film HA and the insulating film GF2 other than a portion covered with the gate electrode GE2 can be removed by dry etching performed in the patterning step of the silicon film PS2 or wet etching performed after the dry etching.

In the control transistor forming region 1A1 of the memory cell region 1A, the insulating film GF2 and the Hf-containing film HA remaining under the control gate electrode CG serve as the gate insulating film CF of the control transistor 2. Further, in the memory transistor forming region 1A2 of the memory cell region 1A, the insulating film MZ and the Hf-containing film HA remaining under the memory gate electrode MG serve as the gate insulating film MF of the memory transistor 3. The gate insulating film MF is a gate insulating film having a charge storage portion (corresponding to the above-mentioned insulating film MZ2). Furthermore, in the transistor forming region 1C, the insulating film GF2 and the Hf-containing film HA remaining under the gate electrode GE2 serve as the gate insulating film TF2 of the MISFET 5.

In this way, the structure of FIGS. 57 and 58 is obtained, but the structure of FIGS. 57 and 58 is the same as the structure of FIGS. 21 and 22. That is, in FIG. 57, in the memory transistor forming region 1A2 of the memory cell region 1A, the memory gate electrode MG is formed over the semiconductor substrate SB (on the p-type well PW1) via the gate insulating film MF and, in the control transistor forming region 1A1 of the memory cell region 1A, the control gate electrode CG is formed over the semiconductor substrate SB (on the p-type well PW1) via the gate insulating film CF. Further, in FIG. 58, in the transistor forming region 1B, the gate electrode GE1 is formed over the semiconductor substrate SB (on the p-type well PW2) via the gate insulating film TF1 and, in the transistor forming region 1C, the gate electrode GE2 is formed over the semiconductor substrate SB (on the p-type well PW3) via the gate insulating film TF2.

Regarding subsequent steps, the present third embodiment is also the same as the first embodiment, and the steps described with reference to FIGS. 23 to 32 are performed, but a repetitive description thereof is omitted here.

Further, as a modification example of the present third embodiment, after obtaining the structure of FIGS. 53 and 54, performed can also be a step of removing the silicon films PS1 and the insulating films GF1 in the memory cell region 1A and the transistor forming region 1C by using the photolithography technique and the etching technique. At this time, since the transistor forming region 1B is covered with the photoresist film, the silicon film PS1 and the insulating film GF1 in the transistor forming region 1B remain. Then, by using the photolithography technique and the etching technique to pattern the silicon films PS2 in the memory cell region 1A and the transistor forming region 1C and the silicon film PS1 in the transistor forming region 1B, the control gate electrode CG, the memory gate electrode MG, the memory gate electrode MG, and the gate electrodes GE1 and GE2 are formed, which makes it possible to obtain the structure shown by FIGS. 57 and 58.

The present third embodiment can easily and accurately form, on or over the common semiconductor substrate SB, a transistor having a gate insulating film introducing Hf (hafnium) (here, the control transistor 2, memory transistor 3, and MISFET 5) and a transistor having a gate insulating film introducing no Hf (hafnium) (here, the MISFET 4).

In the manufacturing process described with reference to FIGS. 37 to 58, the gate insulating film CF of the control transistor 2, the gate insulating film MF of the memory transistor 3, and the gate insulating film TF2 of the MISFET 5 contain Hf (hafnium), that is, Hf (hafnium) is introduced therein. Therefore, as compared with the case where no Hf (hafnium) is introduced in the gate insulating films CF, MF, TF2, the case where Hf (hafnium) is introduced in the gate insulating films CF, MF, TF2 can increase each threshold voltage of the control transistor 2, the memory transistor 3, and the MISFET 5, thereby making it possible to reduce (decrease) the leakage current at the time of being turned off. Further, in the manufacturing process described with reference to FIGS. 37 to 58, the gate insulating film TF1 of the MISFET 4 contains no Hf (hafnium), that is, Hf (hafnium) is not introduced therein. Therefore, as compared with the case where Hf (hafnium) is introduced in the gate insulating film TF1, the case where no Hf (hafnium) is introduced in the gate insulating film TF1 can reduce the threshold voltage of the MISFET 4, thereby making it possible to increase the on-current.

In addition, unlike the present third embodiment, after obtaining a structure of FIGS. 45 and 46 and before forming the silicon film PS2, it is also conceivable to remove the Hf-containing film HA and the insulating film GF2 in the transistor forming region 1B, form the insulating film GF1 over the surface of the semiconductor substrate SB (on the p-type well PW2) in the transistor forming region 1B, and then form the silicon film PS2. In this case, by patterning the silicon film PS2, the control gate electrode CG, the memory gate electrode MG, and the gate electrodes GE1 and GE2 can be formed, so that the silicon film PS1 does not have to be formed. However, in this case, since the step of forming the insulating film GF1 needs to be performed in a state where the Hf-containing film HA is exposed, the Hf-containing film HA may be contaminated or change in quality and the characteristics of the transistor having the gate insulating film introducing HF may deteriorate or fluctuate. Furthermore, when the insulating film GF1 is formed by the thermal oxidation method, the thickness of the insulating film GF2 may increase at a time of forming the insulating film GF1d and the characteristics of the transistor having the gate insulating film introducing Hf may deviate from the design value.

In contrast, the present third embodiment forms the silicon film PS2 as shown in FIGS. 47 and 48 after obtaining the structure of FIGS. 45 and 46 and then removes, as shown in FIGS. 49 and 50, the silicon film PS2, the Hf-containing film HA, and the insulating film GF2 in the transistor forming region 1B. Thereafter, as shown in FIGS. 51 and 52, the insulating film GF1 is formed over the surface of the semiconductor substrate SB (on the p-type well PW2) in the transistor forming region 1B. For this reason, in the case of the third embodiment, the step of forming the insulating film GF1 is performed in a state where the Hf-containing film HA is covered with the silicon film PS2. This makes it possible to suppress or prevent contamination and alteration of the Hf-containing film HA in the step of forming the insulating film GF1. Furthermore, even when the insulating film GF1 is formed by the thermal oxidation method, an increase in thickness of the insulating film GF2 can be suppressed or prevented at the time of forming the insulating film GF1. This makes it possible to prevent deterioration and fluctuation of the characteristics of the transistor having the gate insulating film into which Hf is introduced, and to form a transistor having desired characteristics. Accordingly, the performance of the semiconductor device can be improved.

In addition, in the cases of the first and second embodiments, since the step of forming the insulating film GF1 is performed before forming the Hf-containing film HA, the step of forming the insulating film GF1 does not adversely affect the Hf-containing film HA. This makes it possible to prevent deterioration and fluctuation of the characteristics of the transistor having the gate insulating film introducing Hf and to form a transistor having desired characteristics. Therefore, the performance of the semiconductor device can be improved.

Although the invention made by the present inventors has been specifically described based on the embodiments thereof, the present invention is not limited to the above-mentioned embodiments and, needless to say, can be variously modified without departing from the gist thereof.

What is claimed is:

1. A method of manufacturing a semiconductor device, the method comprising:
    (a) forming a first insulating film on first, second, and third regions of a semiconductor substrate;
    (b) forming a first conductive film on the first insulating film;
    (c) removing the first insulating film and the first conductive film on the second and third regions of the semiconductor substrate to leave the first insulating film and the first conductive film on the first region of the semiconductor substrate;
    (d) forming a third insulating film on the first, second, and third regions of the semiconductor substrate;
    (e) removing the third insulating film on the first and second regions of the semiconductor substrate;
    (f) forming a second insulating film on the first, second, and third regions of the semiconductor substrate;
    (g) removing the second insulating film on the first and third regions of the semiconductor substrate;
    (h) forming, on the first, second, and third regions of the semiconductor substrate, a first film containing a first element;
    (i) forming a second conductive film on the first, second, and third regions of the semiconductor substrate; and (j) forming a second gate electrode and a third gate electrode by patterning the second conductive film, and forming a first gate electrode by patterning the first conductive film, wherein the first element is any of Hf, Al, or Zr, wherein the first gate insulating film is formed of the first insulating film, wherein the second gate insulating film is formed of the second insulating film and the first film, wherein the third gate insulating film is formed of the third insulating film and the first film, and wherein the third insulating film is an insulating film having a charge storage portion.

2. The method according to claim 1, wherein each of the first and second conductive films is a silicon film.

3. The method according to claim 1, the first insulating film is a silicon oxide film.

4. The method according to claim 1, wherein the second insulating film is a silicon oxide film.

5. The method according to claim 1, wherein the first film is any of a hafnium film, a hafnium oxide film, an aluminum film, an aluminum oxide film, a zirconium film, and a zirconium oxide film.

6. The method according to claim 1, wherein the first element is Hf.

7. The method according to claim 6, wherein the first film is a hafnium film.

8. The method according to claim 1, wherein the first film is formed by a sputtering method in the (h).

9. The method according to claim 1, wherein the (j) includes:

(j1) removing the second conductive film on the first conductive film and patterning the second conductive film located on the second region of the semiconductor substrate to form the second gate electrode composed of the patterned second conductive film and patterning the second conductive film located on the third region of the semiconductor substrate to form the third gate electrode composed of the patterned second conductive film; and (j2) patterning, after the (j1), the first conductive film located on the first region of the semiconductor substrate to form the first gate electrode composed of the patterned first conductive film.

10. The method according to claim 1, wherein the (i) includes:

(j3) removing the second conductive film on the first conductive film; and (j4) patterning, after the (j3), the first and second conductive films to form the first gate electrode composed of the patterned first conductive film, the second gate electrode composed of the patterned first second conductive film, and the third gate electrode composed of the patterned second conductive film.

11. A method of manufacturing a semiconductor device, the method comprising:

(a) forming a third insulating film on first, second and third regions of a semiconductor substrate;

(b) removing the third insulating film on the first and second regions of the semiconductor substrate;

(c) forming a second insulating film on the first, second, and third regions of the semiconductor substrate;

(d) removing the second insulating film on the third region of the semiconductor substrate to leave the second insulating on the first and second regions of the semiconductor substrate;

(e) forming, on the second and third regions, a first film containing a first element;

(f) forming, on a first film, a second conductive film;

(g) removing the second insulating film, the first film, and the second conductive film on the first region of the semiconductor substrate;

(h) forming, on the first, second, and third regions of the semiconductor substrate, a first insulating film;

(i) forming a first conductive film on the first insulating film; and (j) forming a second gate electrode and a third gate electrode by patterning the second conductive film, and forming a first gate electrode by patterning the first conductive film, wherein the first element is any of Hf, Al, or Zr, wherein the first gate insulating film is formed of the first insulating film, and wherein the second gate insulating film is formed of the second insulating film and the first film.

12. The method according to claim 11, wherein each of the first and second conductive films is a silicon film.

13. The method according to claim 11, wherein the first film is any of a hafnium film, a hafnium oxide film, an aluminum film, an aluminum oxide film, a zirconium film, and a zirconium oxide film.

14. The method according to claim 11, wherein the first element is Hf.

15. The method according to claim 14, wherein the first film is a hafnium film.

16. The method according to claim 11, wherein the first film is formed by a sputtering method in the (b).

17. The method according to claim 11, wherein the (j) includes:

(j1) removing the first conductive film on the second conductive film and patterning the first conductive film located on the first region of the semiconductor substrate to form the first gate electrode composed of the patterned first conductive film and patterning the second conductive film located on the third region of the semiconductor substrate to form the third gate electrode composed of the patterned second conductive film; and (j2) patterning, after the (j), the second conductive film located on the second region of the semiconductor substrate to form the second gate electrode composed of the patterned second conductive film.

18. The method according to claim 11, wherein the (j) includes:

(j3) removing the first conductive film on the second conductive film; and (j4) patterning, after the (j3), the first and second conductive films to form the first gate electrode composed of the patterned first conductive film and the second gate electrode composed of the patterned second conductive film and the third gate electrode composed of the patterned second conductive film.

* * * * *